(12) United States Patent
Yu et al.

(10) Patent No.: US 11,177,238 B2
(45) Date of Patent: *Nov. 16, 2021

(54) SEMICONDUCTOR STRUCTURE

(71) Applicant: TAIWAN SEMICONDUCTOR MANUFACTURING COMPANY LTD., Hsinchu (TW)

(72) Inventors: Chen-Hua Yu, Hsinchu (TW); Chi-Hsi Wu, Hsinchu (TW); Der-Chyang Yeh, Hsinchu (TW); Hsien-Wei Chen, Hsinchu (TW); An-Jhih Su, Taoyuan County (TW); Tien-Chung Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,176

(22) Filed: Dec. 13, 2019

(65) Prior Publication Data

US 2020/0118974 A1 Apr. 16, 2020

Related U.S. Application Data

(62) Division of application No. 14/968,517, filed on Dec. 14, 2015, now Pat. No. 10,510,715.

(51) Int. Cl.
*H01L 25/065* (2006.01)
*H01L 25/00* (2006.01)

(52) U.S. Cl.
CPC ......... *H01L 25/0652* (2013.01); *H01L 25/50* (2013.01); *H01L 2225/06562* (2013.01); *H01L 2225/06582* (2013.01); *H01L 2225/06593* (2013.01)

(58) Field of Classification Search
CPC . H01L 25/0652; H01L 25/50; H01L 25/0657; H01L 2225/06562; H01L 2225/06582; H01L 2225/06593
See application file for complete search history.

(56) References Cited

U.S. PATENT DOCUMENTS

| 6,930,378 B1* | 8/2005 | St. Amand | .......... H01L 25/0657 257/686 |
| 7,777,348 B2* | 8/2010 | Kodama | .............. H01L 25/0657 257/777 |
| 2008/0174000 A1* | 7/2008 | Chen | ..................... H01L 23/525 257/686 |

* cited by examiner

*Primary Examiner* — Timor Karimy
(74) *Attorney, Agent, or Firm* — WPAT, P.C., Intellectual Property Attorneys; Anthony King

(57) ABSTRACT

A semiconductor structure includes a plurality of first dies, a second die disposed over each of the first dies, and a dielectric material surrounding the first dies and the second die. The second dies overlaps a portion of each of the first dies. A dimension of the second die is different from a dimension of the first dies.

20 Claims, 18 Drawing Sheets

SEMICONDUCTOR STRUCTURE

PRIORITY CLAIM AND CROSS-REFERENCE

This patent is a divisional application of U.S. patent application Ser. No. 14/968,517 filed on Dec. 14, 2015, entitled of "SEMICONDUCTOR STRUCTURE AND MANUFACTURING METHOD THEREOF", which is incorporated by reference in its entirety.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as inaccurate placement of components, poor electrical interconnection, development of cracks, delamination of the components or high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

Since more different components with different materials are involved, a complexity of the manufacturing operations of the semiconductor device is increased. There are more challenges to modify a structure of the semiconductor device and improve the manufacturing operations. As such, there is a continuous need to improve the manufacturing of the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
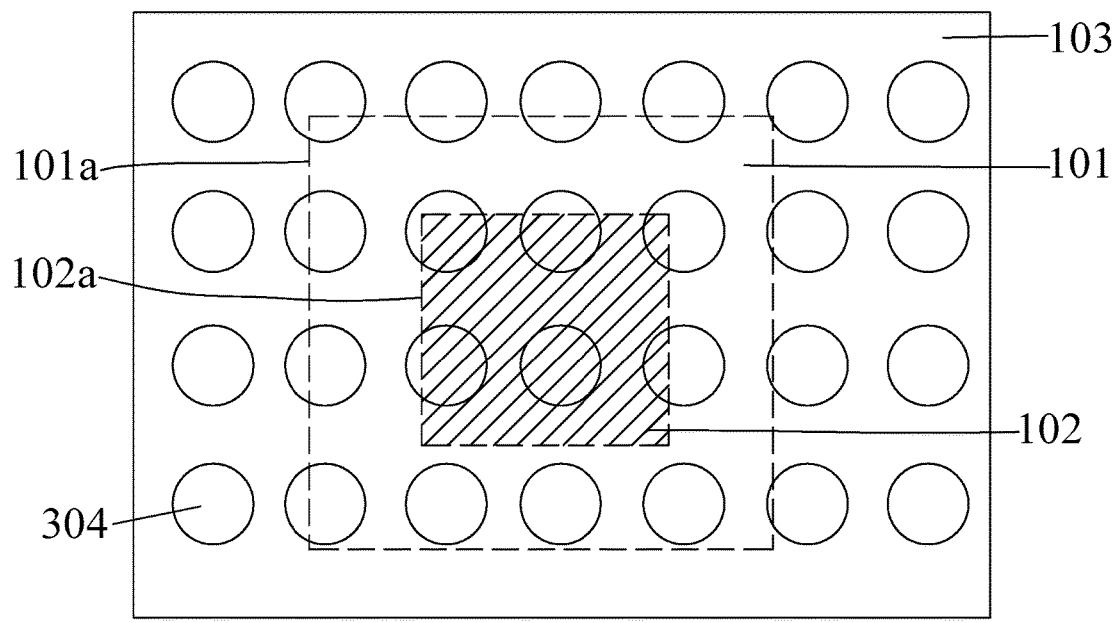
FIG. 1 is a schematic top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dies are fabricated from a semiconductive wafer. The semiconductive wafer includes numbers of die areas. The wafer is sawn along several scribe line regions to singulate several dies from the wafer. After singulation, several dies are stacked over each other and integrated to become a semiconductor package. The dies are encapsulated by a molding which protects the dies from contamination and damages.

However, the dies and the molding involve different kinds of materials with different thermal properties (e.g. different coefficient of thermal expansion (CTE), etc.), and as such an internal stress inside the dies and the molding would be developed during subsequent thermal processes such as heat treatment, reflowing, etc. The internal stress would cause a formation of crack between the dies and the molding. The crack can propagate through the molding to further weaken integration and configuration of the semiconductor package, and ultimately result in a poor reliability or failure of the semiconductor package.

In the present disclosure, a semiconductor structure with improvement is disclosed. The semiconductor structure includes at least two dies stacking over each other and a dielectric material or molding encapsulating the dies. The dies are not vertically aligned with each other, that an edge of one die is protruded from another die. An edge of one die overlaid with an edge of another die is absent. None of edges of the dies is aligned. Such misalignment of the dies can reduce internal stress of the semiconductor structure and thus minimize or prevent a development of crack in the molding or between the dies and the molding. A reliability or performance of the semiconductor structure is improved.

Figure 2:
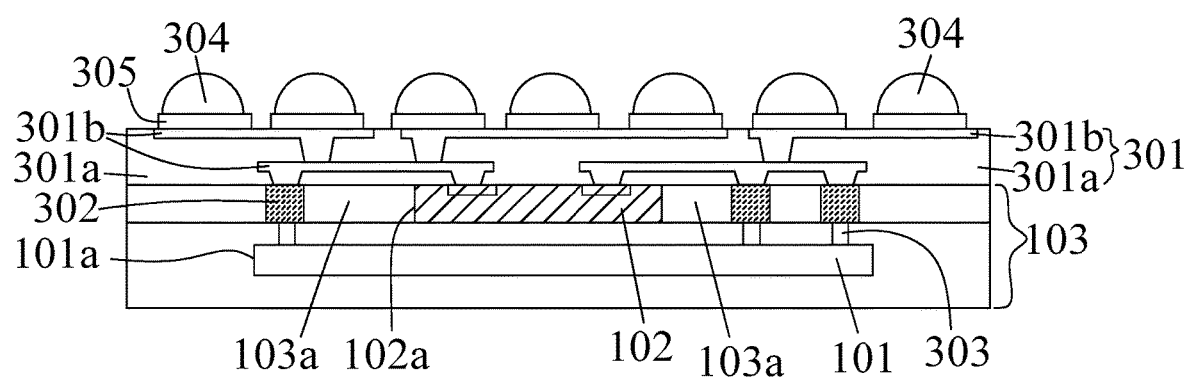
FIG. 2 is a schematic cross sectional view of a semiconductor structure of FIG. 1.

FIGS. 1 and 2 are a semiconductor structure in accordance with various embodiments of the present disclosure. FIG. 1 shows a top view of the semiconductor structure and FIG. 2 shows a cross sectional view of the semiconductor structure of FIG. 1. In some embodiments, the semiconductor structure includes a first die 101, a second die 102 and a dielectric material 103. In some embodiments, the semiconductor structure is a package. FIGS. 1 and 2 illustrate the semiconductor structure includes two dies, however it is understood that the semiconductor structure can include two or more dies. It is not intended to limit a number of dies in the semiconductor structure.

In some embodiments, the first die 101 includes a semiconductive substrate fabricated with a predetermined functional circuit over the semiconductive substrate. In some embodiments, the first die 101 is formed by singulation of a semiconductive wafer. In some embodiments, the first die 101 is fabricated to perform specific functions. In some embodiments, the first die 101 is fabricated as a memory die, a micro processing die, dynamic random access memory (DRAM) die, application-specific integrated circuits (ASIC) die and the like. In some embodiments, the first die 101 includes several conductive lines and several electrical components such as transistor, diode, etc. connected by the conductive lines.

In some embodiments, the first die 101 includes semiconductive material such as silicon, germanium, gallium, arsenic, and combinations thereof. In some embodiments, the first die 101 includes material such as ceramic, glass, etc. In some embodiments, the first die 101 is in a quadrilateral, rectangular, square, polygonal or any other suitable shapes.

In some embodiments, the second die 102 is disposed over the first die 101. In some embodiments, the second die 102 is vertically stacked over the first die 101. In some embodiments, the second die 102 is overlaid with the first die 101. In some embodiments, the second die 102 has similar or different configuration as the first die 101. In some embodiments, the second die 102 includes a semiconductive substrate fabricated with a predetermined functional circuit over the semiconductive substrate. In some embodiments, the second die 102 is fabricated to perform specific functions different from or same as the first die 101. In some embodiments, the second die 102 includes several conductive lines and several electrical components such as transistor, diode, etc. connected by the conductive lines. In some embodiments, a circuitry of the second die 102 is integrated with a circuitry of the first die 101.

In some embodiments, the second die 102 includes semiconductive material such as silicon, germanium, gallium, arsenic, and combinations thereof. In some embodiments, the second die 102 includes material such as ceramic, glass, etc. In some embodiments, the second die 102 has a shape same as or different from the first die 101. In some embodiments, the second die 102 is in a quadrilateral, rectangular, square, polygonal or any other suitable shapes. In some embodiments, the second die 102 has a dimension same as or different from the first die 101. In some embodiments as illustrated in FIGS. 1 and 2, the first die 101 has a dimension substantially greater than the second die 102, and the first die 101 and the second die 102 are in a quadrilateral shape.

In some embodiments, the dielectric material 103 surrounds the first die 101 and the second die 102. In some embodiments, the first die 101 and the second die 102 are encapsulated by the dielectric material 103 to prevent from contamination or damages. In some embodiments, the first die 101 is isolated from the second die 102 by the dielectric material 103. In some embodiments, the dielectric material 103 includes composite materials. In some embodiments, the dielectric material 103 includes polymer such as polybenzoxazole (PBO), polyimide, benzocyclobutene (BCB), or the like. In other embodiments, the dielectric material 103 includes a nitride such as silicon nitride or the like. In some embodiments, the dielectric material 103 includes an oxide such as silicon oxide or the like.

In some embodiments, the dielectric material 103 includes molding material. In some embodiments, the dielectric material 103 is a molding compound. In some embodiments, the dielectric material 103 is a single layer film or a composite stack. In some embodiments, the dielectric material 103 includes various materials such as epoxy resins, phenolic hardeners, silicas, catalysts, pigments, mold release agents or the like.

In some embodiments, an edge of the first die 101 is disposed away from an edge of the second die 102. In some embodiments, at least one of edges of the first die 101 is disposed away from one of edges of the second die 102. In some embodiments, none of edges of the first die 101 is aligned with one of edges of the second die 102.

In some embodiments, at least a portion of an edge 101*a* of the first die 101 is laterally protruded from an edge 102*a* of the second die 102. In some embodiments, a portion 103*a* of the dielectric material 103 covers the portion of the edge 101*a* of the first die 101 and surrounds the second die 102. In some embodiments, a corner of the first die 101 is protruded from the second die 102. In some embodiments, the portion 103*a* of the dielectric material 103 is disposed over the corner of the first die 101.

In some embodiments, the first die 101 and the second die 102 are electrically connected through interconnect structures. In some embodiments, the first die 101 is electrically connected with the second die 102 by several conductive pillars 303 or conductive bumps disposed over the second die 102. In some embodiments, the first die 101 and the second die 102 is electrically connected by wire bonding. In some embodiments, the first die 101 includes several die pads disposed within or over the first die 101 and connected with the conductive pillar 303 or conductive bump. In some embodiments, several through vias 302 extending through the dielectric material 103 is electrically connected with the conductive pillars 303. In some embodiments, the through via 302 is disposed over the first die 101. In some embodiments, the through via 302 is disposed away from the first die 101, that the through via 302 is not overlaid the first die 101. In some embodiments, the through via 302 is disposed adjacent to the second die 102.

In some embodiments, a redistribution layer (RDL) 301 is disposed over the dielectric material 103, the first die 101 and the second die 102. In some embodiments, the RDL 301 includes one or more dielectric layers 301*a* disposed over the dielectric material 103 and several conductive lines 301*b* surrounded by the dielectric layers 301*a*. In some embodiments, the second die 102 includes several die pads disposed over or within the second die 102 and connected with the conductive lines 301*b*. In some embodiments, the first die 101 and the second die 102 are electrically connected through the conductive pillar 303, the through via 302 and the conductive line 301*b*. In some embodiments, the second die 102 is electrically connected with a conductive bump 304 through the conductive line 301*b*. The conductive line 301*b* is configured to re-route a path from the die pad of the second die 102 to the conductive bump 304. In some embodiments, a bump pad 305 is disposed over and electrically connected with the conductive line 301*b*. In some embodiments, the conductive bump 304 is disposed over the bump pad 305. In some embodiments, the conductive bump 304 is configured to be disposed over and electrically connected with a circuitry or a circuit board.

Figure 3:
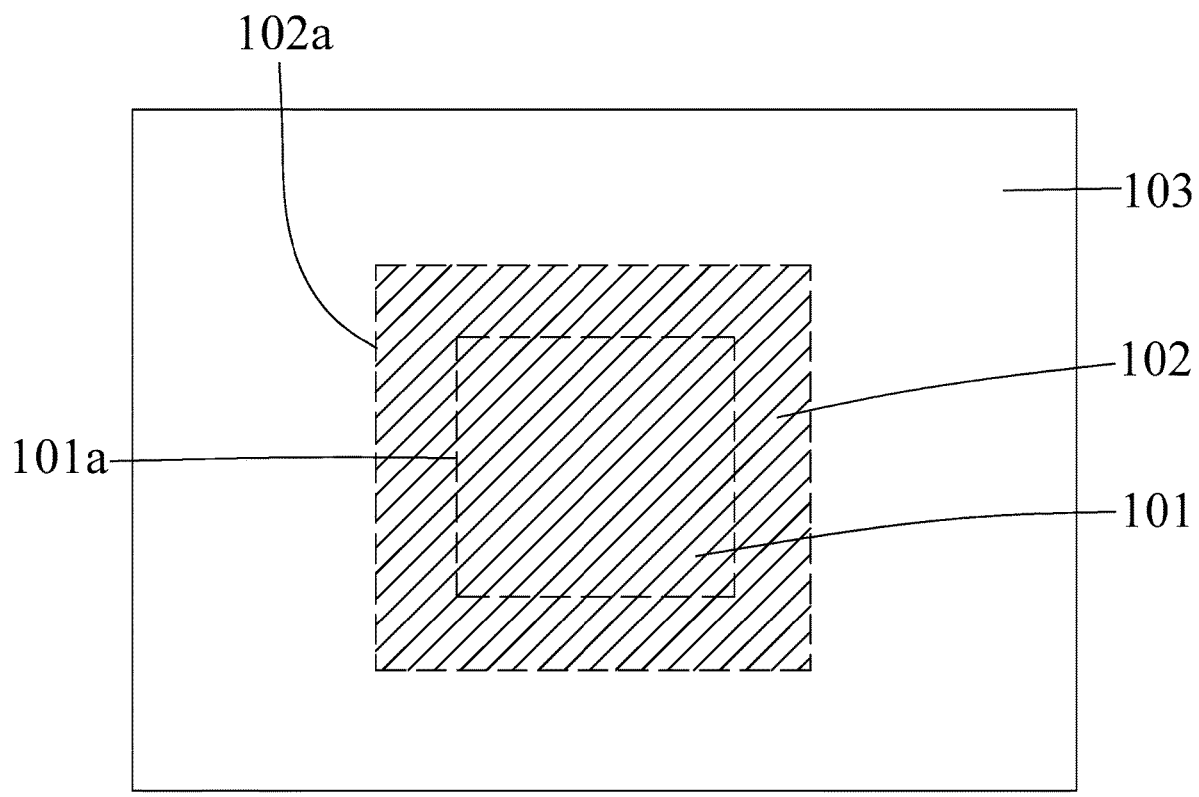
FIG. 3 is a schematic top view of a semiconductor structure in accordance with some embodiments of the present disclosure.
Figure 4:
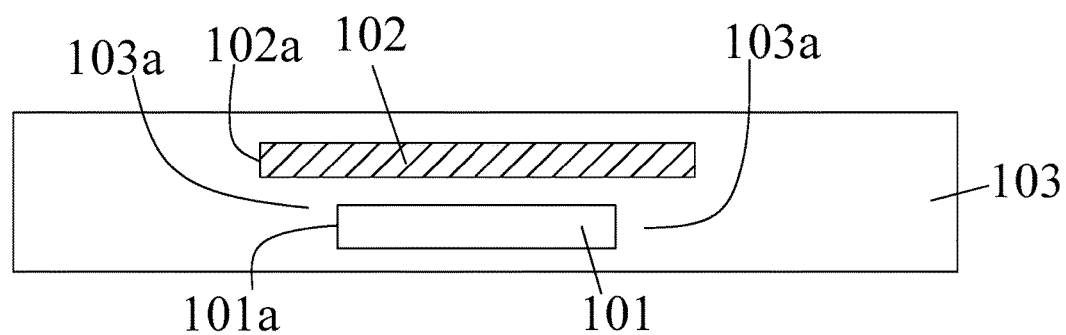
FIG. 4 is a schematic cross sectional view of a semiconductor structure of FIG. 3.

FIGS. 3 and 4 are a semiconductor structure in accordance with various embodiments of the present disclosure. FIG. 3 shows a top view of the semiconductor structure and FIG. 4 shows a cross sectional view of the semiconductor structure of FIG. 3. In some embodiments, the semiconductor structure includes a first die 101, a second die 102 and a dielectric material 103, which have similar configuration as described above or illustrated in FIG. 1 or 2. In some embodiments, the second die 102 is vertically stacked over the first die 101. In some embodiments, the second die 102 is overlaid with the first die 101. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 3-4. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 has a dimension substantially smaller than a dimension of the second die 102. In some embodiments, an edge of the first die 101 is disposed away from an edge of the second die 102. In some embodiments, none of edges of the first die 101 is aligned with one of edges of the second die 102.

In some embodiments, at least a portion of an edge 102*a* of the second die 102 is laterally protruded from an edge 101*a* of the first die 101. In some embodiments, the portion of the edge 102*a* of the second die 102 protruded from the edge 101*a* of the first die 101 is disposed over a portion 103*a* of the dielectric material 103. In some embodiments, the portion of the edge 102*a* of the second die 102 covers the portion 103*a* of the dielectric material 103 surrounding the first die 101. In some embodiments, a corner of the second die 102 is protruded from the first die 101. In some embodiments, the corner of the second die 102 is disposed over the portion 103*a* of the dielectric material 103.

Figure 5:
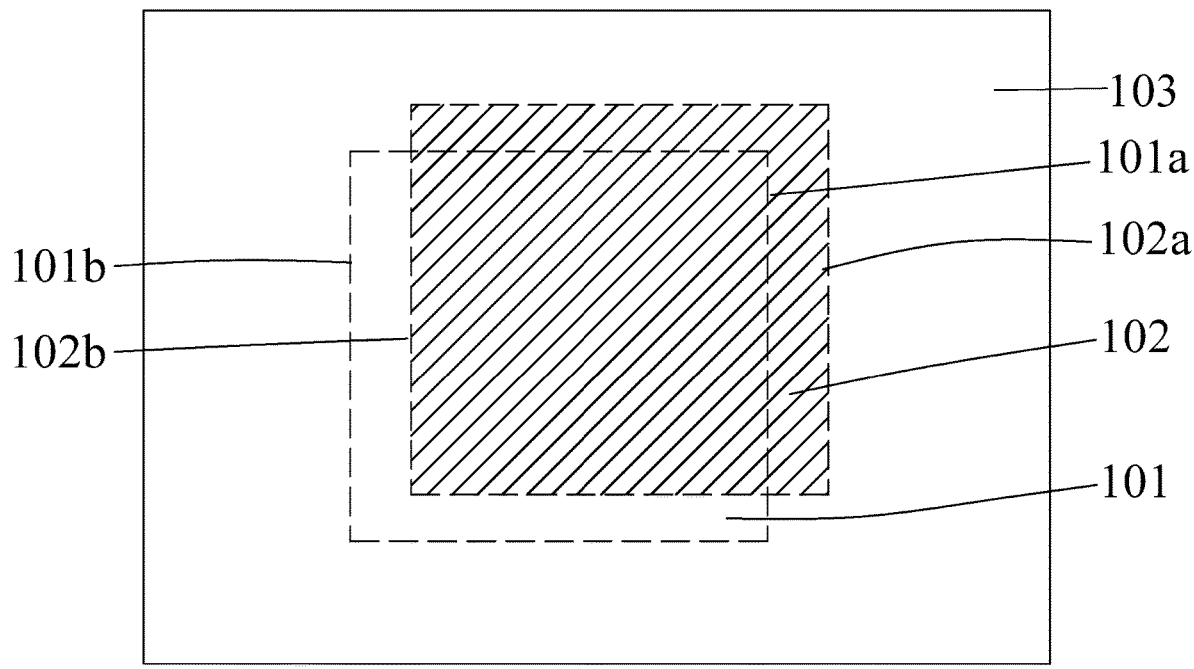
FIG. 5 is a schematic top view of a semiconductor structure in accordance with some embodiments of the present disclosure.
Figure 6:
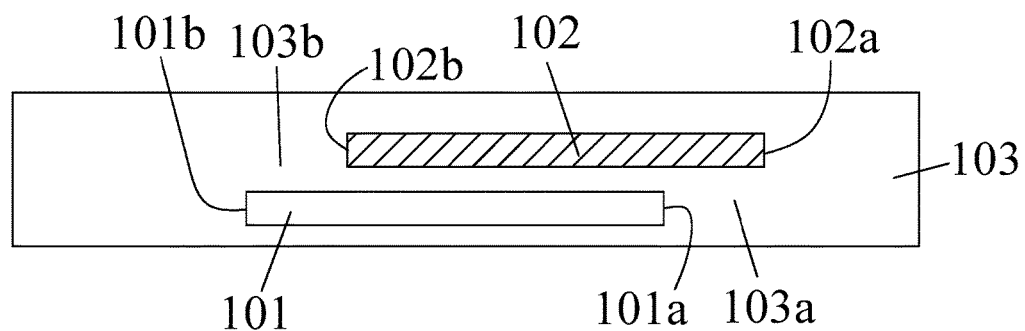
FIG. 6 is a schematic cross sectional view of a semiconductor structure of FIG. 5.

FIGS. 5 and 6 are a semiconductor structure in accordance with various embodiments of the present disclosure. FIG. 5 shows a top view of the semiconductor structure and FIG. 6 shows a cross sectional view of the semiconductor structure of FIG. 5. In some embodiments, the semiconductor structure includes a first die 101, a second die 102 and a dielectric material 103, which have similar configuration as described above or illustrated in any one of FIGS. 1-4. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 5-6. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially same dimension and shape. In some embodiments, an edge of the first die 101 is disposed away from an edge of the second die 102. In some embodiments, all edges of the first die 101 are disposed away from all edges of the second die 102. In some embodiments, none of edges of the first die 101 is aligned with one of edges of the second die 102.

In some embodiments, the second die 102 is offset from the first die 101. In some embodiments, edges of the second die 102 are offset from edges of the first die 101. In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103.

In some embodiments, at least a portion of a second edge 101b of the first die 101 is laterally protruded from a second edge 102b of the second die 102. In some embodiments, a second portion 103b of the dielectric material 103 is disposed over the second edge 101b of the first die 101. In some embodiments, a corner of the second die 102 is protruded from the first die 101. In some embodiments, the corner of the second die 102 is disposed over the first portion 103a of the dielectric material 103. In some embodiments, a corner of the first die 101 is protruded from the second die 102. In some embodiments, the second portion 103b of the dielectric material 103 is disposed over the corner of the first die 101.

Figure 7:
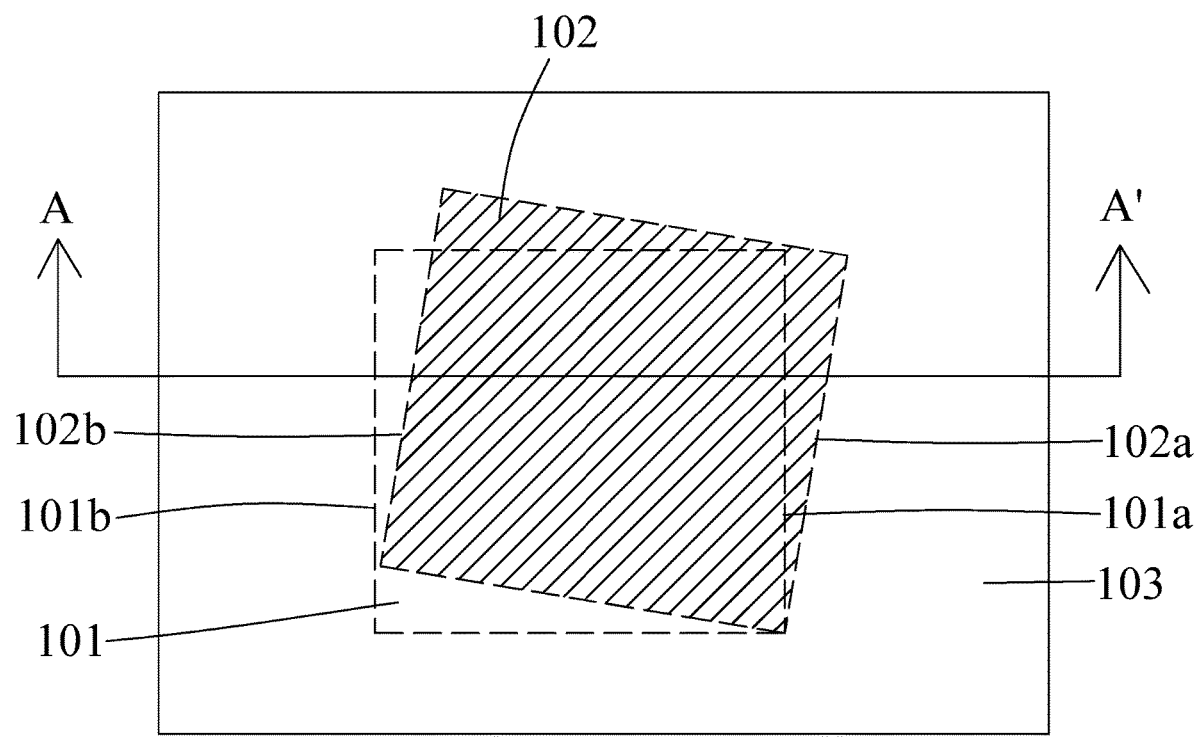
FIG. 7 is a schematic top view of a semiconductor structure in accordance with some embodiments of the present disclosure.
Figure 8:
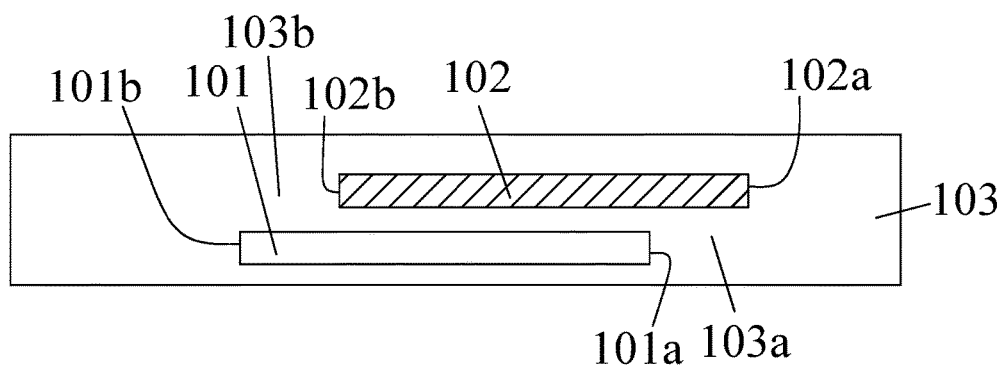
FIG. 8 is a schematic cross sectional view of a semiconductor structure of FIG. 7 along AA'.

FIGS. 7 and 8 are a semiconductor structure in accordance with various embodiments of the present disclosure. FIG. 7 shows a top view of the semiconductor structure and FIG. 8 shows a cross sectional view of the semiconductor structure of FIG. 7 along AA'. In some embodiments, the semiconductor structure includes a first die 101, a second die 102 and a dielectric material 103, which have similar configuration as described above or illustrated in any one of FIGS. 1-6. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 7-8. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially same dimension and shape. In some embodiments, an edge of the first die 101 is disposed away from an edge of the second die 102. In some embodiments, all edges of the first die 101 are not aligned with all edges of the second die 102. In some embodiments, none of edges of the first die 101 is aligned with one of edges of the second die 102.

In some embodiments, a corner of the first die 101 is vertically aligned over a corner of the second die 102, and the second die 102 is rotated about the corner of the second die 102 relative to the first die 101. In some embodiments, the second die 102 is rotated about the corner of the second die 102 aligned with the corner of the first die 101 in an angle of smaller than about 180°. In some embodiments, the second die 102 is rotated in the angle of about 5° to 175°.

In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103. In some embodiments, at least a portion of a second edge 101b of the first die 101 is laterally protruded from a second edge 102b of the second die 102. In some embodiments, a second portion 103b of the dielectric material 103 is disposed over the second edge 101b of the first die 101. In some embodiments, a corner of the second die 102 is protruded from the first die 101. In some embodiments, the corner of the second die 102 is disposed over the first portion 103a of the dielectric material 103. In some embodiments, a corner of the first die 101 is protruded from the second die 102. In some embodiments, the second portion 103b of the dielectric material 103 is disposed over the corner of the first die 101.

Figure 9:
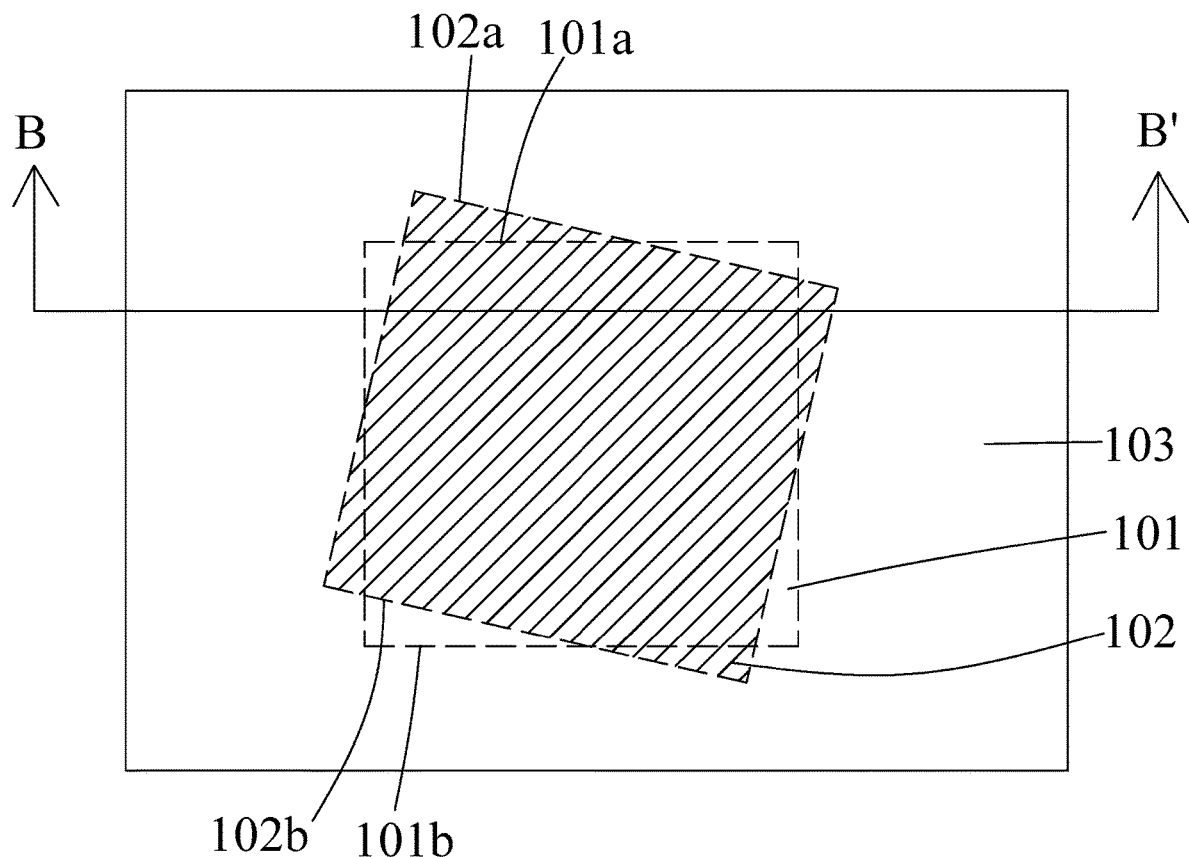
FIG. 9 is a schematic top view of a semiconductor structure in accordance with some embodiments of the present disclosure.
Figure 10:
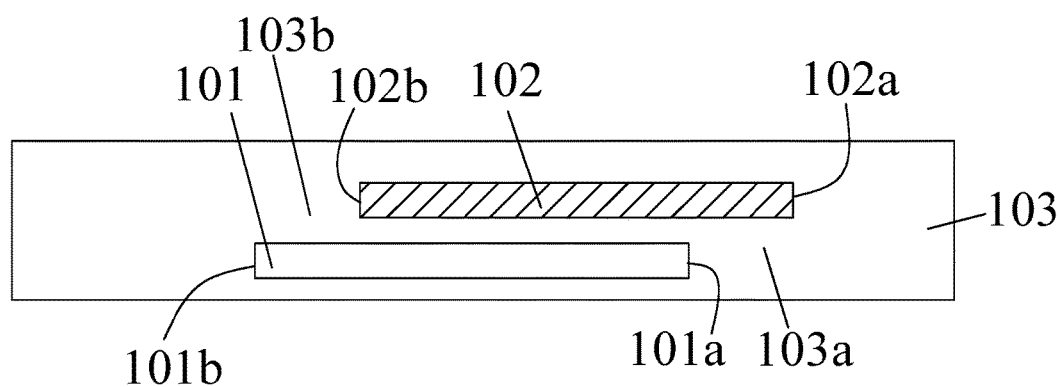
FIG. 10 is a schematic cross sectional view of a semiconductor structure of FIG. 9 along BB'.

FIGS. 9 and 10 are a semiconductor structure in accordance with various embodiments of the present disclosure. FIG. 9 shows a top view of the semiconductor structure and FIG. 10 shows a cross sectional view of the semiconductor structure of FIG. 7 along BB'. In some embodiments, the semiconductor structure includes a first die 101, a second die 102 and a dielectric material 103, which have similar configuration as described above or illustrated in any one of FIGS. 1-8. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 9-10. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially same dimension and shape. In some embodiments, an edge of the first die 101 is disposed away from an edge of the second die 102. In some embodiments, all edges of the first die 101 are not aligned with all edges of the second die 102. In some embodiments, none of edges of the first die 101 is aligned with one of edges of the second die 102.

In some embodiments, a center of the first die 101 is vertically aligned over a center of the second die 102, and the second die 102 is rotated about the center of the second die 102 relative to the first die 101. In some embodiments, the second die 102 is rotated about the center of the second die 102 aligned with the center of the first die 101 in an angle of smaller than about 90°. In some embodiments, the second die 102 is rotated in the angle of about 5° to 85°.

In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103. In some embodiments, at least a portion of a second edge 101b of the first die 101 is laterally protruded from a second edge 102b of the second die 102. In some embodiments, a second portion 103b of the dielectric material 103 is disposed over the second edge 101b of the first die 101. In some embodiments, a corner of the second die 102 is protruded from the first die 101. In some embodiments, the corner of the second die 102 is disposed over the first portion 103a of the dielectric material 103. In some embodiments, a corner of the first die 101 is protruded from the second die 102. In some embodiments, the second portion 103b of the dielectric material 103 is disposed over the corner of the first die 101.

Figure 11:
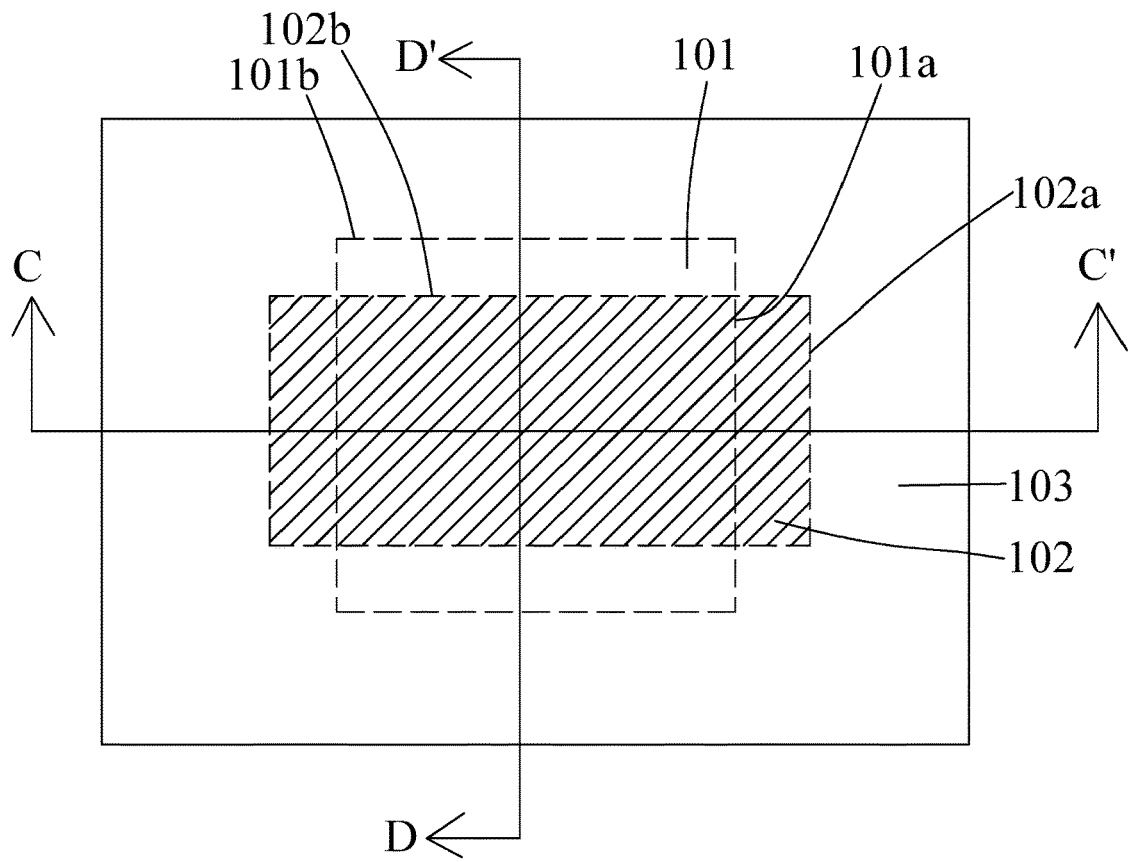
FIG. 11 is a schematic top view of a semiconductor structure in accordance with some embodiments of the present disclosure.
Figure 12:
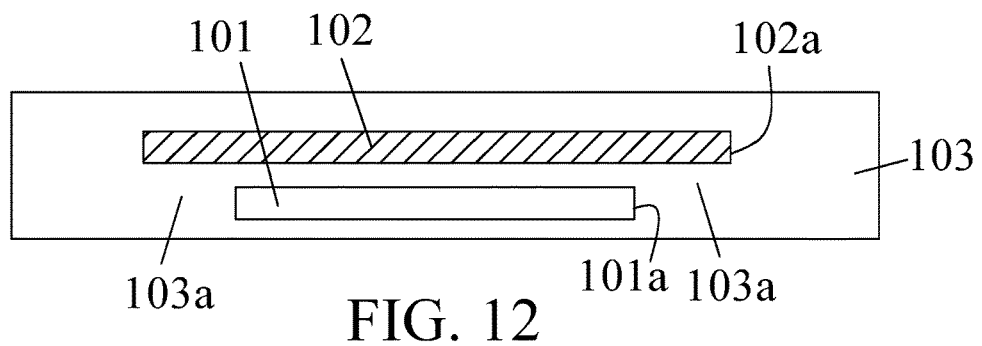
FIG. 12 is a schematic cross sectional view of a semiconductor structure of FIG. 11 along CC'.
Figure 13:
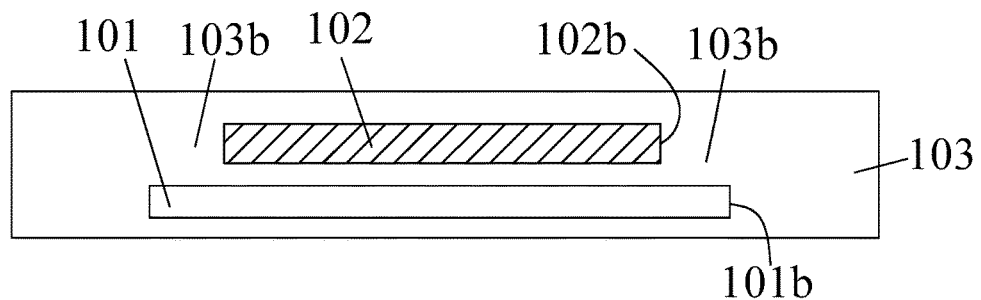
FIG. 13 is a schematic cross sectional view of a semiconductor structure of FIG. 11 along DD'.

FIGS. 11-13 are a semiconductor structure in accordance with various embodiments of the present disclosure. FIG. 11 shows a top view of the semiconductor structure, FIG. 12 shows a cross sectional view of the semiconductor structure of FIG. 11 along CC', and FIG. 13 shows a cross sectional view of the semiconductor structure of FIG. 11 along DD'. In some embodiments, the semiconductor structure includes a first die 101, a second die 102 and a dielectric material 103, which have similar configuration as described above or illustrated in any one of FIGS. 1-10. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 11-13. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially different dimension or shape. In some embodiments, an edge of the first die 101 is disposed away from an edge of the second die 102. In some embodiments, all edges of the first die 101 are not aligned with all edges of the second die 102. In some embodiments, none of edges of the first die 101 is aligned with one of edges of the second die 102.

In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103. In some embodiments, a corner of the second die 102 is protruded from the first die 101. In some embodiments, the corner of the second die 102 is disposed over the first portion 103a of the dielectric material 103.

In some embodiments, at least a portion of a second edge 101b of the first die 101 is laterally protruded from a second edge 102b of the second die 102. In some embodiments, a second portion 103b of the dielectric material 103 is disposed over the second edge 101b of the first die 101. In some embodiments, a corner of the first die 101 is protruded from the second die 102. In some embodiments, the second portion 103b of the dielectric material 103 is disposed over the corner of the first die 101.

Figure 14:
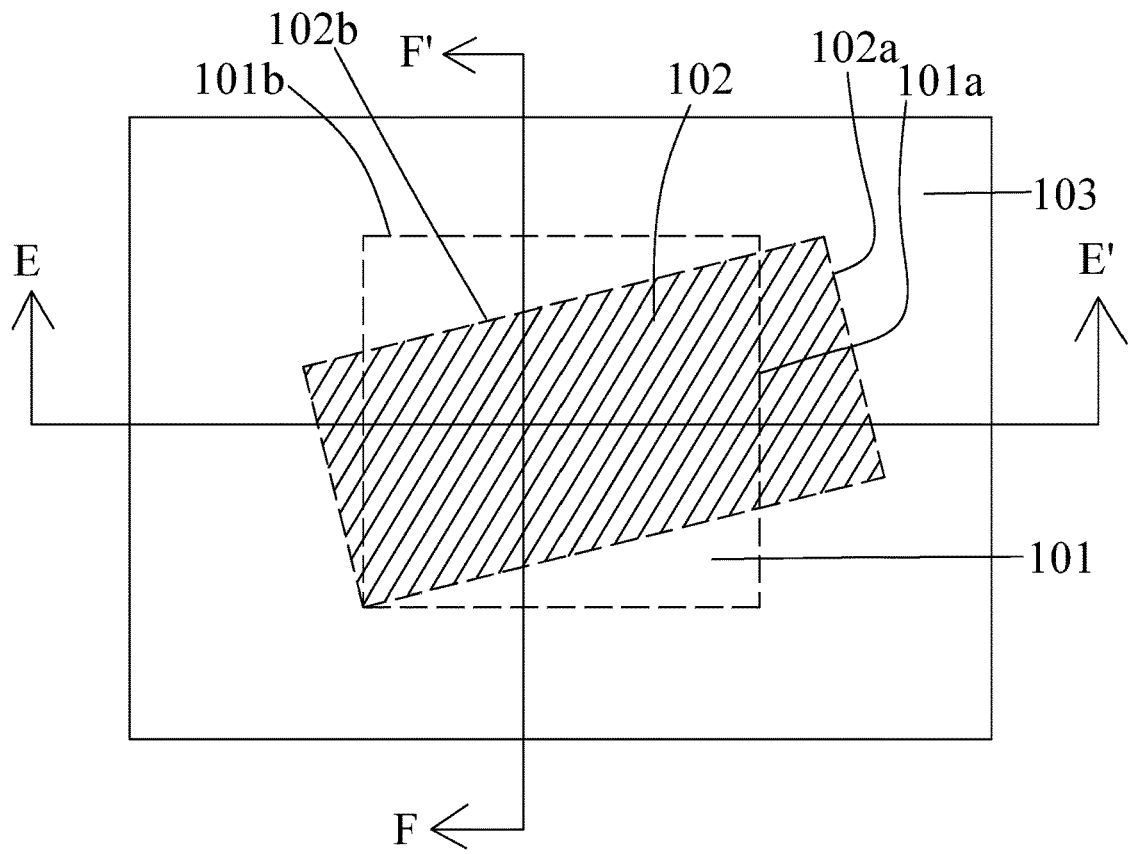
FIG. 14 is a schematic top view of a semiconductor structure in accordance with some embodiments of the present disclosure.
Figure 15:
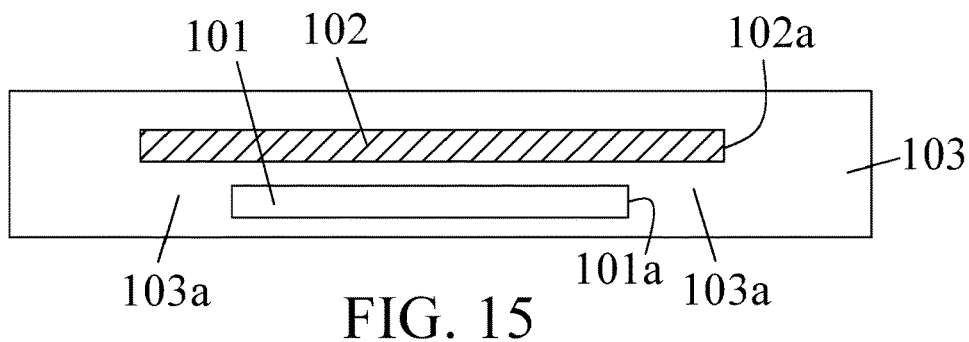
FIG. 15 is a schematic cross sectional view of a semiconductor structure of FIG. 14 along EE'.
Figure 16:
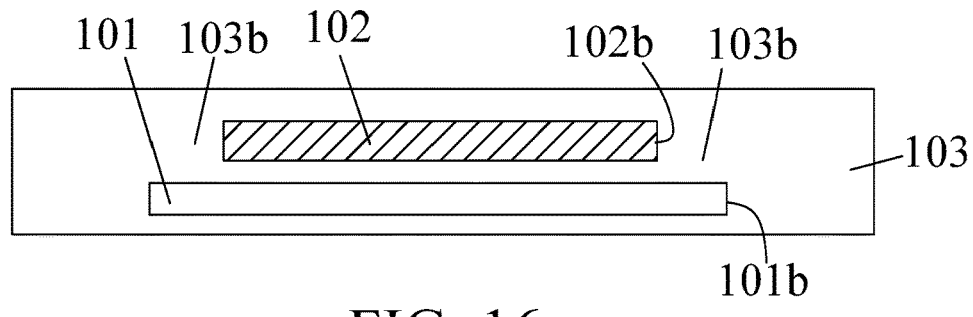
FIG. 16 is a schematic cross sectional view of a semiconductor structure of FIG. 14 along FF'.

FIGS. 14-16 are a semiconductor structure in accordance with various embodiments of the present disclosure. FIG. 14 shows a top view of the semiconductor structure, FIG. 15 shows a cross sectional view of the semiconductor structure of FIG. 14 along EE', and FIG. 16 shows a cross sectional view of the semiconductor structure of FIG. 14 along FF'. In some embodiments, the semiconductor structure includes a first die 101, a second die 102 and a dielectric material 103, which have similar configuration as described above or illustrated in any one of FIGS. 1-13. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 14-16. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially different dimension or shape. In some embodiments, an edge of the first die 101 is disposed away from an edge of the second die 102. In some embodiments, all edges of the first die 101 are not aligned with all edges of the second die 102. In some embodiments, none of edges of the first die 101 is aligned with one of edges of the second die 102.

In some embodiments, a corner of the first die 101 is vertically aligned over a corner of the second die 102, and the second die 102 is rotated about the corner of the second die 102 relative to the first die 101. In some embodiments, the second die 102 is rotated about the corner of the second die 102 aligned with the corner of the first die 101 in an angle of smaller than about 180°. In some embodiments, the second die 102 is rotated in the angle of about 5° to about 175°.

In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103. In some embodiments, a corner of the second die 102 is protruded from the first die 101. In some embodiments, the corner of the second die 102 is disposed over the first portion 103a of the dielectric material 103.

In some embodiments, at least a portion of a second edge 101b of the first die 101 is laterally protruded from a second edge 102b of the second die 102. In some embodiments, a second portion 103b of the dielectric material 103 is disposed over the edge of the first die 101. In some embodiments, a corner of the first die 101 is protruded from the second die 102. In some embodiments, the second portion 103b of the dielectric material 103 is disposed over the corner of the first die 101.

Figure 17:
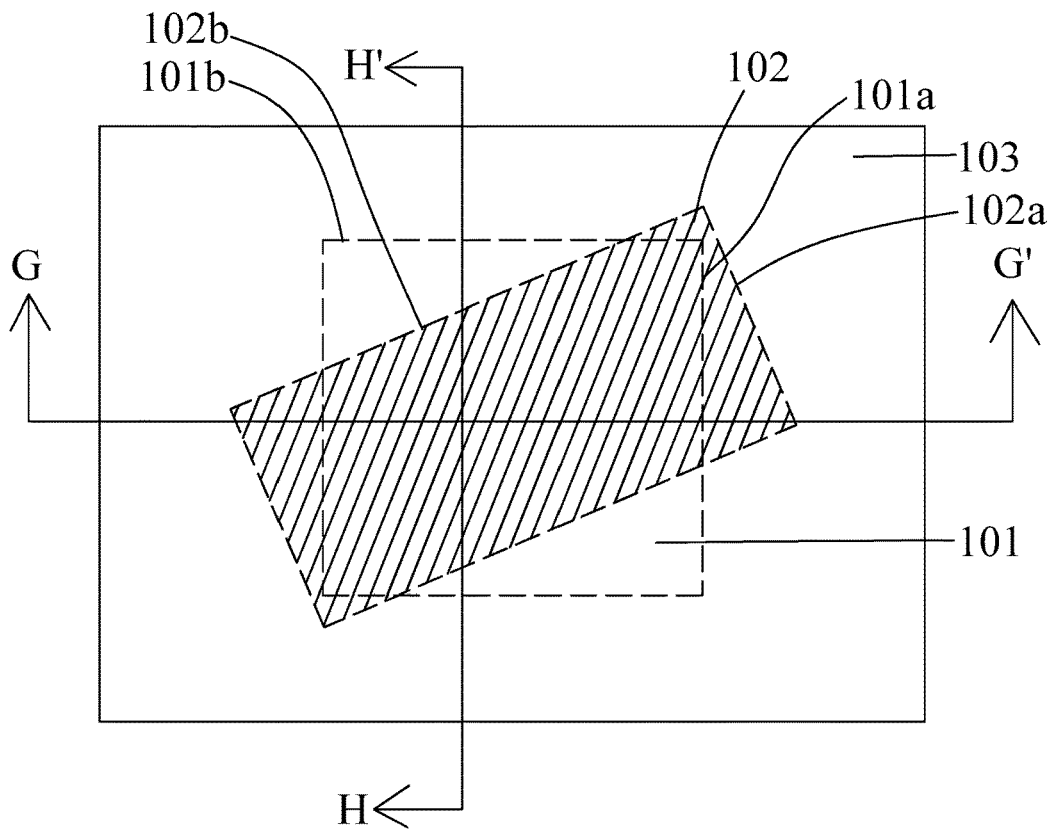
FIG. 17 is a schematic top view of a semiconductor structure in accordance with some embodiments of the present disclosure.
Figure 18:
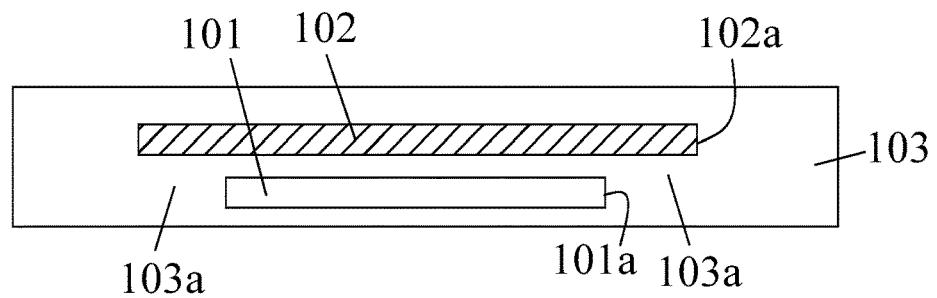
FIG. 18 is a schematic cross sectional view of a semiconductor structure of FIG. 17 along GG'.
Figure 19:
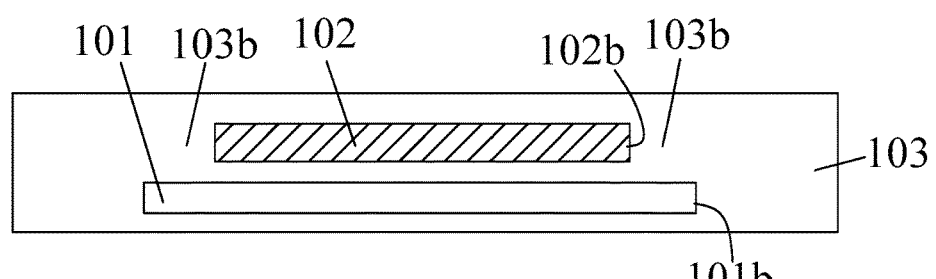
FIG. 19 is a schematic cross sectional view of a semiconductor structure of FIG. 17 along HH'.

FIGS. 17-19 are a semiconductor structure in accordance with various embodiments of the present disclosure. FIG. 17 shows a top view of the semiconductor structure, FIG. 18 shows a cross sectional view of the semiconductor structure of FIG. 17 along GG', and FIG. 19 shows a cross sectional view of the semiconductor structure of FIG. 17 along HH'. In some embodiments, the semiconductor structure includes a first die 101, a second die 102 and a dielectric material 103, which have similar configuration as described above or illustrated in any one of FIGS. 1-16. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 17-19. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 101 and the second die 102 have substantially different dimension or shape. In some embodiments, an edge of the first die 101 is disposed away from an edge of the second die 102. In some embodiments, all edges of the first die 101 are not aligned with all edges of the second die 102. In some embodiments, none of edges of the first die 101 is aligned with one of edges of the second die 102.

In some embodiments, a center of the first die 101 is vertically aligned over a center of the second die 102, and the second die 102 is rotated about the center of the second die 102 relative to the first die 101. In some embodiments, the second die 102 is rotated about the center of the second die 102 aligned with the center of the first die 101 in an angle of smaller than about 90°. In some embodiments, the second die 102 is rotated in the angle of about 5° to 85°.

In some embodiments, at least a portion of a first edge 102a of the second die 102 is laterally protruded from a first edge 101a of the first die 101. In some embodiments, the portion of the first edge 102a of the second die 102 protruded from the first edge 101a of the first die 101 is disposed over a first portion 103a of the dielectric material 103. In some embodiments, a corner of the second die 102 is protruded from the first die 101. In some embodiments, the corner of the second die 102 is disposed over the first portion 103a of the dielectric material 103.

In some embodiments, at least a portion of a second edge 101b of the first die 101 is laterally protruded from a second edge of the second die 102. In some embodiments, a second portion 103b of the dielectric material 103 is disposed over the edge of the first die 101. In some embodiments, a corner of the second die 102 is protruded from the first die 101. In some embodiments, the corner of the second die 102 is disposed over the first portion 103a of the dielectric material 103.

Figure 20:
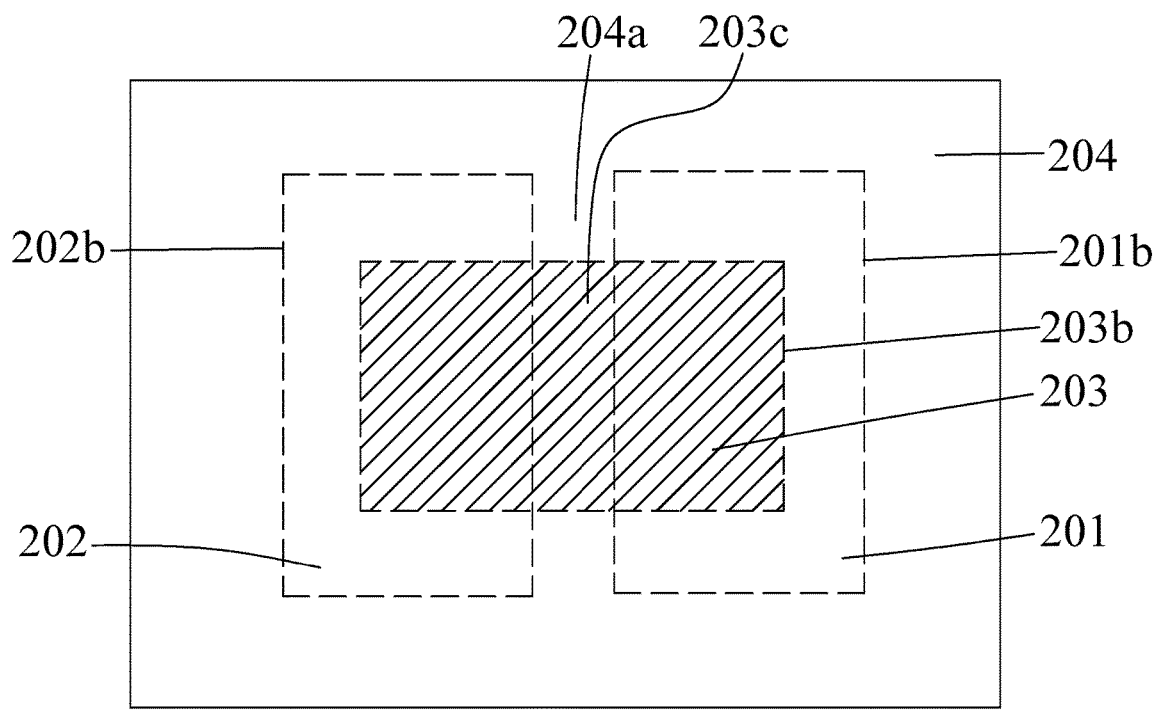
FIG. 20 is a schematic top view of a semiconductor structure in accordance with some embodiments of the present disclosure.
Figure 21:
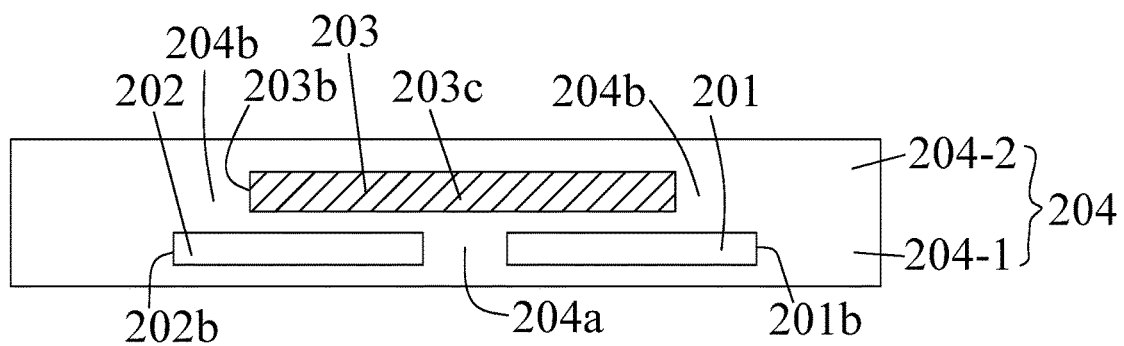
FIG. 21 is a schematic cross sectional view of a semiconductor structure of FIG. 20.

FIGS. 20 and 21 are a semiconductor structure in accordance with various embodiments of the present disclosure. FIG. 20 shows a top view of the semiconductor structure and FIG. 21 shows a cross sectional view of the semiconductor structure of FIG. 20. In some embodiments, the semiconductor structure is a package. In some embodiments, the semiconductor structure includes a first die 201, a second die 202, a third die 203 and a dielectric material 204. In some embodiments, the first die 201, the second die 202 and the dielectric material 204 have similar configuration as the first die 101, the second die 102 and the dielectric material 103 described above or illustrated in any one of FIGS. 1-19. In some embodiments, the third die 203 has similar configuration as the first die 201 or the second die 202. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 20-21. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is disposed adjacent to the second die 202. In some embodiments, the first die 201 is horizontally disposed adjacent to the second die 202. The first die 201 is at a side of the second die 202. In some embodiments, the third die 203 is disposed over the first die 201 or the second die 202. In some embodiments, the third die 203 is vertically stacked over the first die 201 or the second die 202. In some embodiments, an orientation of the third die 203 is orthogonal to an orientation of the first die 201 or the second die 202. In some embodiments, a redistribution layer (RDL) is disposed over the third die 203. In some embodiments, the first die 201, the second die 202 and the third die 203 have substantially same dimension or shape. In some embodiments, the first die 201 and the second die 202 have substantially same dimension or shape, while have substantially different dimension or shape from the third die 203.

In some embodiments, the first die 201, the second die 202 and the third die 203 are surrounded by the dielectric material 204. In some embodiments, the first die 201 and the second die 202 is surrounded by a first dielectric material 204-1, and the third die 203 is surrounded by a second dielectric material 204-2. In some embodiments, the first dielectric material 204-1 or the second dielectric material 204-2 is a molding or includes molding compound.

In some embodiments, an edge of the third die 203 is disposed away from an edge of the first die 201 or an edge of the second die 202. In some embodiments, all edges of the first die 201, all edges of the second die 202 and all edges of the third die 203 are not aligned with each other. In some embodiments, none of edges of the third die 203 is aligned with one of edges of the first die 201 or one of edges of the second die 202.

In some embodiments, at least a portion of an edge 201b of the first die 201 or at least a portion of an edge 202b of the second die 202 is laterally protruded from an edge 203b of the third die 203. In some embodiments, a portion 203c of the third die 203 is protruded from the first die 201 or the second die 202 along a direction parallel to the first die 201 or the second die 202. In some embodiments, the third die 203 is disposed over a first portion 204a of the dielectric material 204. In some embodiments, the portion 203c is disposed over the first portion 204a. In some embodiments, the first portion 204a is disposed between the first die 201 and the second die 202.

In some embodiments, at least a portion of the edge 201b of the first die 201 is protruded from the edge 203b of the third die 203 and away from the second die 202. In some embodiments, at least a portion of the edge 202b of the second die 202 is protruded from the edge 203b of the third die 203 and away from the first die 201. In some embodiments, a second portion 204b of the dielectric material 204 is disposed over the edge 201b of the first die 201 or the edge 202b of the second die 202. In some embodiments, the second portion 204b surrounds the third die 203.

Figure 22:
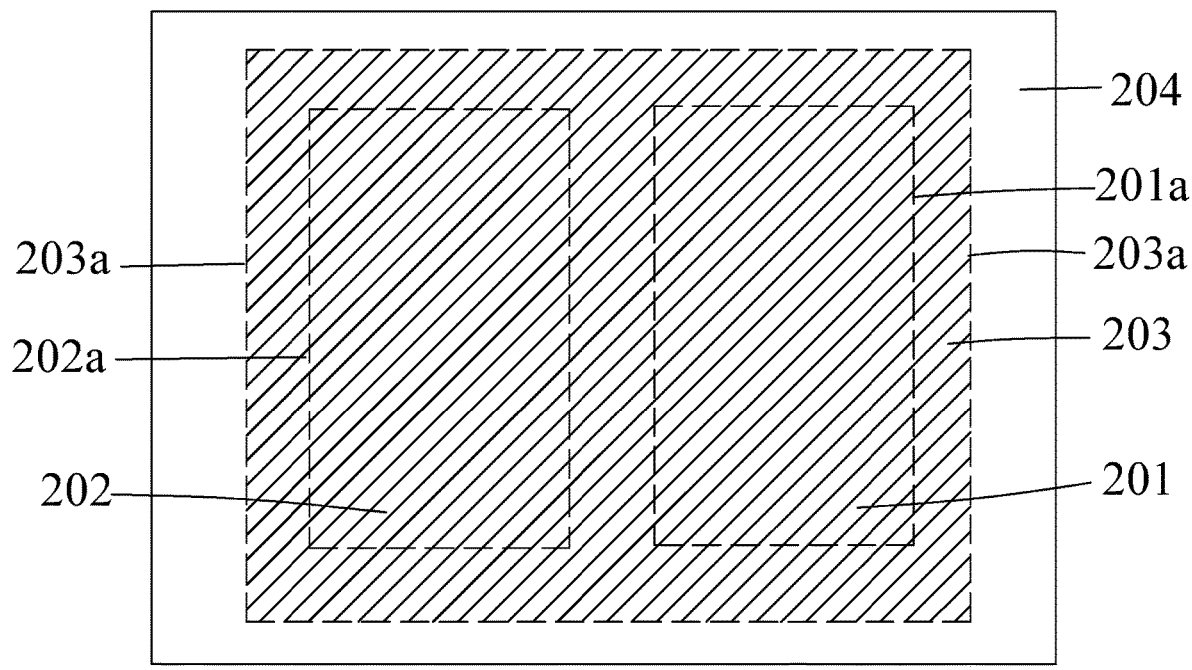
FIG. 22 is a schematic top view of a semiconductor structure in accordance with some embodiments of the present disclosure.
Figure 23:
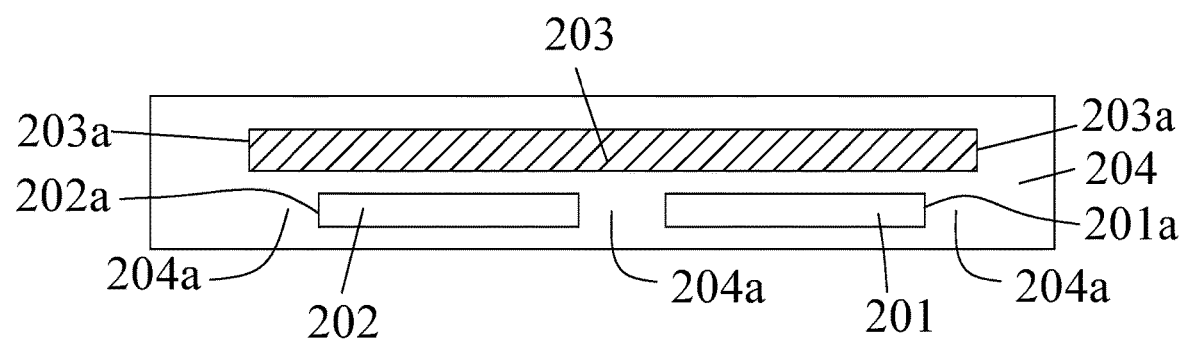
FIG. 23 is a schematic cross sectional view of a semiconductor structure of FIG. 22.

FIGS. 22 and 23 are a semiconductor structure in accordance with various embodiments of the present disclosure. FIG. 22 shows a top view of the semiconductor structure and FIG. 23 shows a cross sectional view of the semiconductor structure of FIG. 22. In some embodiments, the semiconductor structure includes a first die 201, a second die 202, a third die 203 and a dielectric material 204, which have similar configuration as described above or illustrated in any one of FIGS. 20-21. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 22-23. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is horizontally disposed adjacent to the second die 202. In some embodiments, the third die 203 is disposed over the first die 201 or the second die 202. In some embodiments, the first die 201 and the second die 202 have substantially same dimension or shape, while have substantially different dimension or shape from the third die 203. In some embodiments, the third die 203 is substantially larger than the first die 201 or the second die 202.

In some embodiments, the first die 201, the second die 202 and the third die 203 are surrounded by the dielectric material 204. In some embodiments, an edge 203a of the third die 203 is disposed away from an edge 201a of the first die 201 or an edge 202a of the second die 202. In some embodiments, all edges of the first die 201, all edges of the second die 202 and all edges of the third die 203 are not aligned with each other. In some embodiments, none of edges of the third die 203 is aligned with one of edges of the first die 201 or one of edges of the second die 202.

In some embodiments, at least a portion of the edge 203a of the third die 203 is protruded from the edge 201a of the first die 201 or the edge 202a of the second die 202 along a direction parallel to the first die 201 or the second die 202. In some embodiments, the third die 203 is disposed over a first portion 204a of the dielectric material 204. In some embodiments, the first portion 204a is disposed between the first die 201 and the second die 202. In some embodiments, the first portion 204a surrounds the first die 201 or the second die 202.

Figure 24:
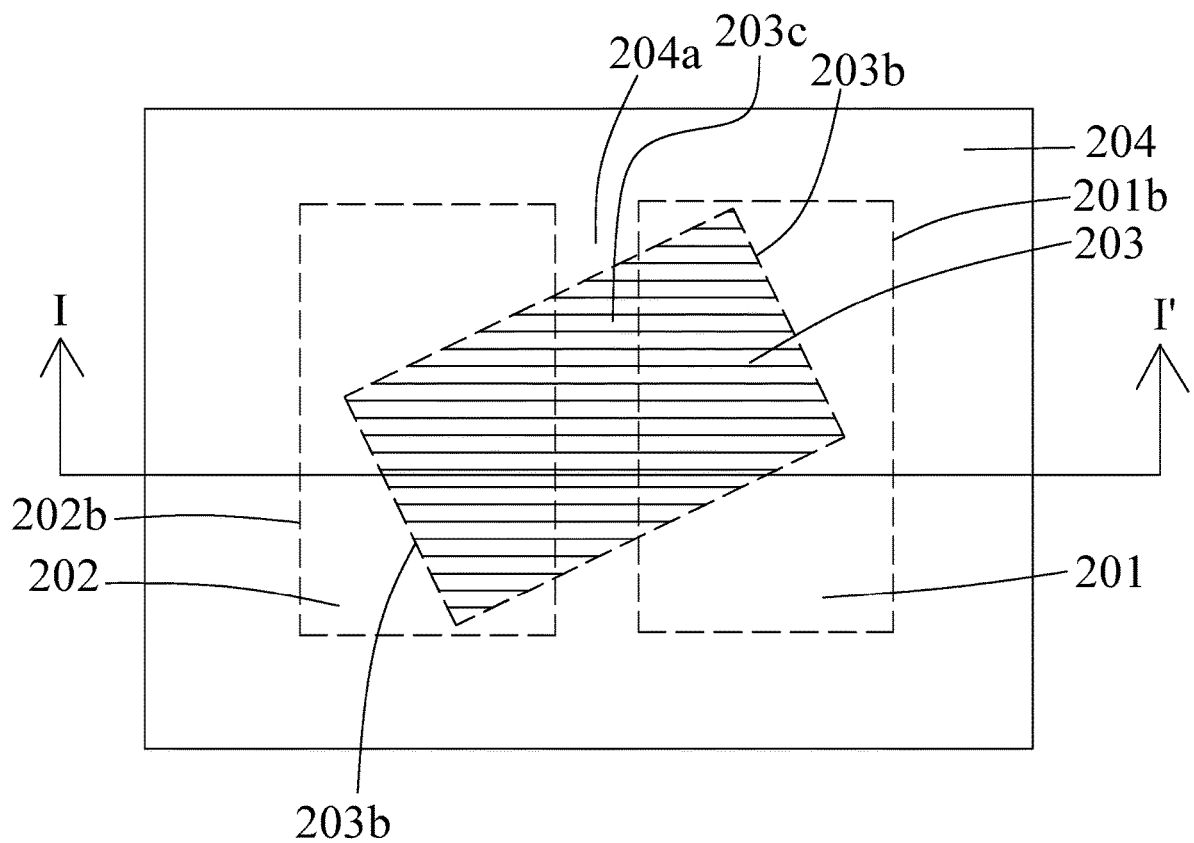
FIG. 24 is a schematic top view of a semiconductor structure in accordance with some embodiments of the present disclosure.
Figure 25:
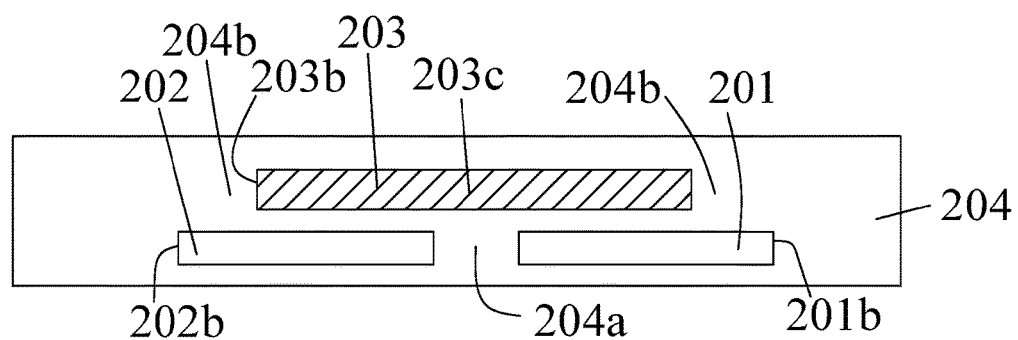
FIG. 25 is a schematic cross sectional view of a semiconductor structure of FIG. 24 along II'.

FIGS. 24 and 25 are a semiconductor structure in accordance with various embodiments of the present disclosure. FIG. 24 shows a top view of the semiconductor structure and FIG. 25 shows a cross sectional view of the semiconductor structure of FIG. 24 along I I'. In some embodiments, the semiconductor structure includes a first die 201, a second die 202, a third die 203 and a dielectric material 204, which have similar configuration as described above or illustrated in any one of FIGS. 20-23. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 24-25. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is horizontally disposed adjacent to the second die 202. In some embodiments, the third die 203 is disposed over the first die 201 or the second die 202. In some embodiments, the first die 201, the second die 202 and the third die 203 have substantially same dimension or shape.

In some embodiments, the first die 201, the second die 202 and the third die 203 are surrounded by the dielectric material 204. In some embodiments, an edge 203b of the third die 203 is disposed away from an edge 201b of the first die 201 or an edge 202b of the second die 202. In some embodiments, all edges of the first die 201, all edges of the second die 202 and all edges of the third die 203 are not aligned with each other. In some embodiments, none of edges of the third die 203 is aligned with one of edges of the first die 201 or one of edges of the second die 202.

In some embodiments, a portion 203c of the third die 203 is protruded from the first die 201 or the second die 202 along a direction parallel to the first die 201 or the second die 202. In some embodiments, the third die 203 is disposed over a first portion 204a of the dielectric material 204. In some embodiments, the first portion 204a is disposed between the first die 201 and the second die 202.

In some embodiments, at least a portion of an edge 201b of the first die 201 is protruded from an edge 203b of the third die 203 and away from the second die 202. In some embodiments, at least a portion of an edge 202b of the second die 202 is protruded from the edge 203b of the third die 203 and away from the first die 201. In some embodiments, a second portion 204b of the dielectric material 204 is disposed over the edge 201b of the first die 201 or the edge 202b of the second die 202. In some embodiments, the second portion 204b surrounds the third die 203.

In some embodiments, the third die 203 is rotated about its center relative to the first die 201 or the second die 202. In some embodiments, the third die 203 is rotated in an angle of smaller than about 180°. In some embodiments, the third die 203 is rotated in the angle of about 5° to about 175°.

Figure 26:
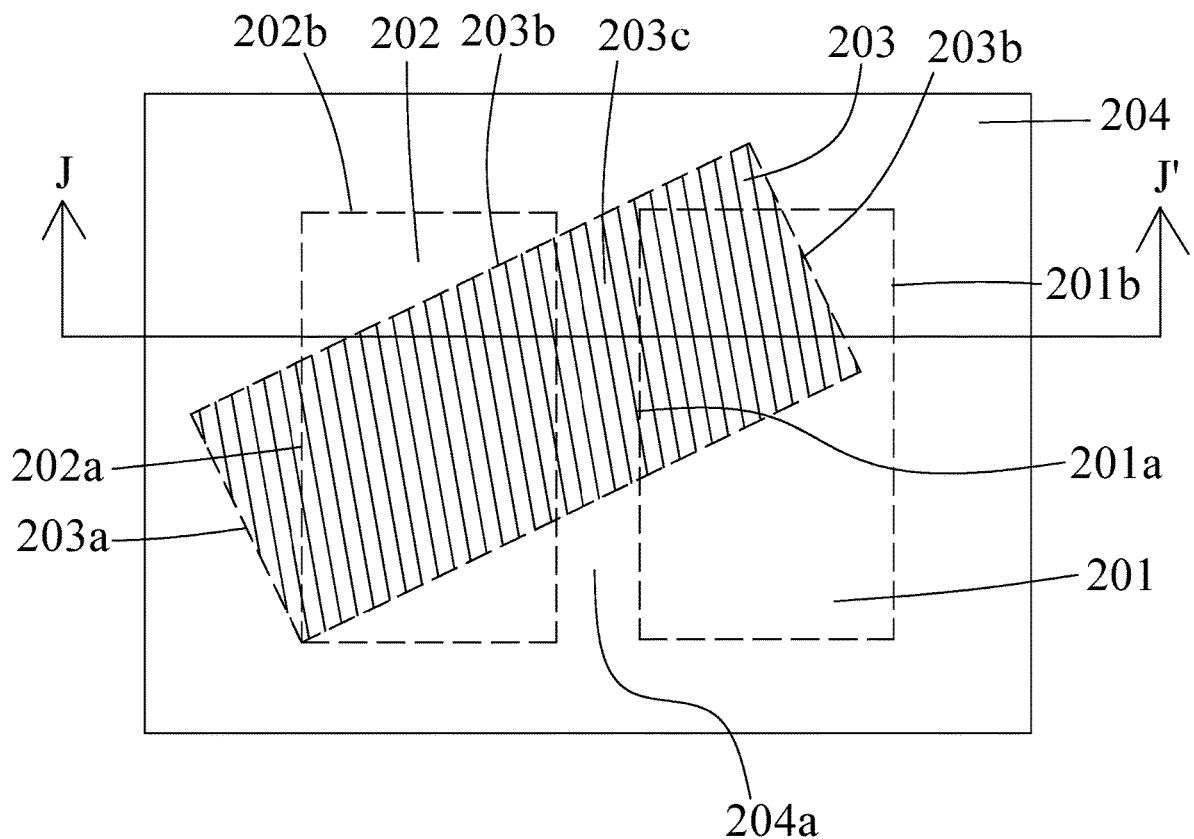
FIG. 26 is a schematic top view of a semiconductor structure in accordance with some embodiments of the present disclosure.
Figure 27:
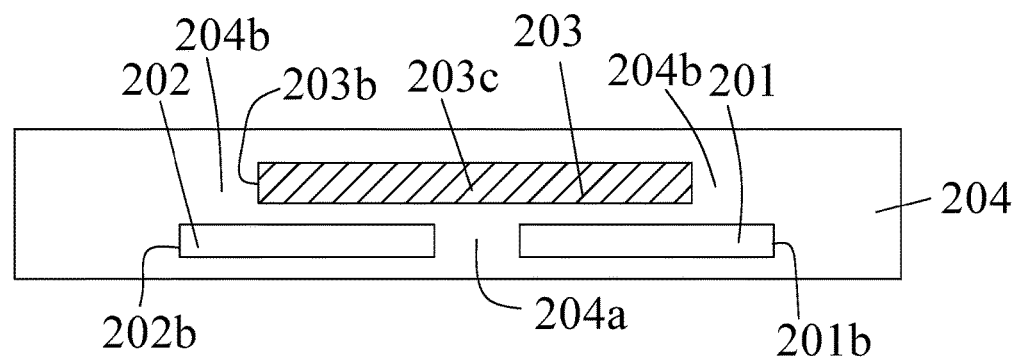
FIG. 27 is a schematic cross sectional view of a semiconductor structure of FIG. 26 along JJ'.

FIGS. 26 and 27 are a semiconductor structure in accordance with various embodiments of the present disclosure. FIG. 26 shows a top view of the semiconductor structure and FIG. 27 shows a cross sectional view of the semiconductor structure of FIG. 26 along JJ'. In some embodiments, the semiconductor structure includes a first die 201, a second die 202, a third die 203 and a dielectric material 204, which have similar configuration as described above or illustrated in any one of FIGS. 20-25. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 26-27. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is horizontally disposed adjacent to the second die 202. In some embodiments, the third die 203 is disposed over the first die 201 or the second die 202. In some embodiments, the first die 201, the second die 202 and the third die 203 have substantially same dimension or shape. In some embodiments, the third die 203 has different dimension or shape from the first die 201 or the second die 202.

In some embodiments, the first die 201, the second die 202 and the third die 203 are surrounded by the dielectric material 204. In some embodiments, an edge of the third die 203 is disposed away from an edge of the first die 201 or an edge of the second die 202. In some embodiments, all edges of the first die 201, all edges of the second die 202 and all edges of the third die 203 are not aligned with each other. In some embodiments, none of edges of the third die 203 is aligned with one of edges of the first die 201 or one of edges of the second die 202.

In some embodiments, a portion 203c of the third die 203 is protruded from the first die 201 or the second die 202 along a direction parallel to the first die 201 or the second die 202. In some embodiments, the third die 203 is disposed over a first portion 204a of the dielectric material 204. In some embodiments, the first portion 204a is disposed between the first die 201 and the second die 202.

In some embodiments, at least a portion of an edge 201b of the first die 201 is protruded from an edge 203b of the third die 203 and away from the second die 202. In some embodiments, at least a portion of an edge 202b of the second die 202 is protruded from the edge 203b of the third die 203 and away from the first die 201. In some embodiments, a second portion 204b of the dielectric material 204 is disposed over the edge 201b of the first die 201 or the edge 202b of the second die 202. In some embodiments, the second portion 204b at least partially surrounds the third die 203.

In some embodiments, a corner of the third die 203 is vertically aligned over a corner of the second die 202, and the third die 203 is rotated about the corner of the third die 203 aligned with the corner of the second die 202 relative to the second die 202 or the first die 201. In some embodiments, the third die 203 is rotated in an angle of smaller than 90°. In some embodiments, the third die 203 is rotated in the angle of about 5° to about 85°.

Figure 28:
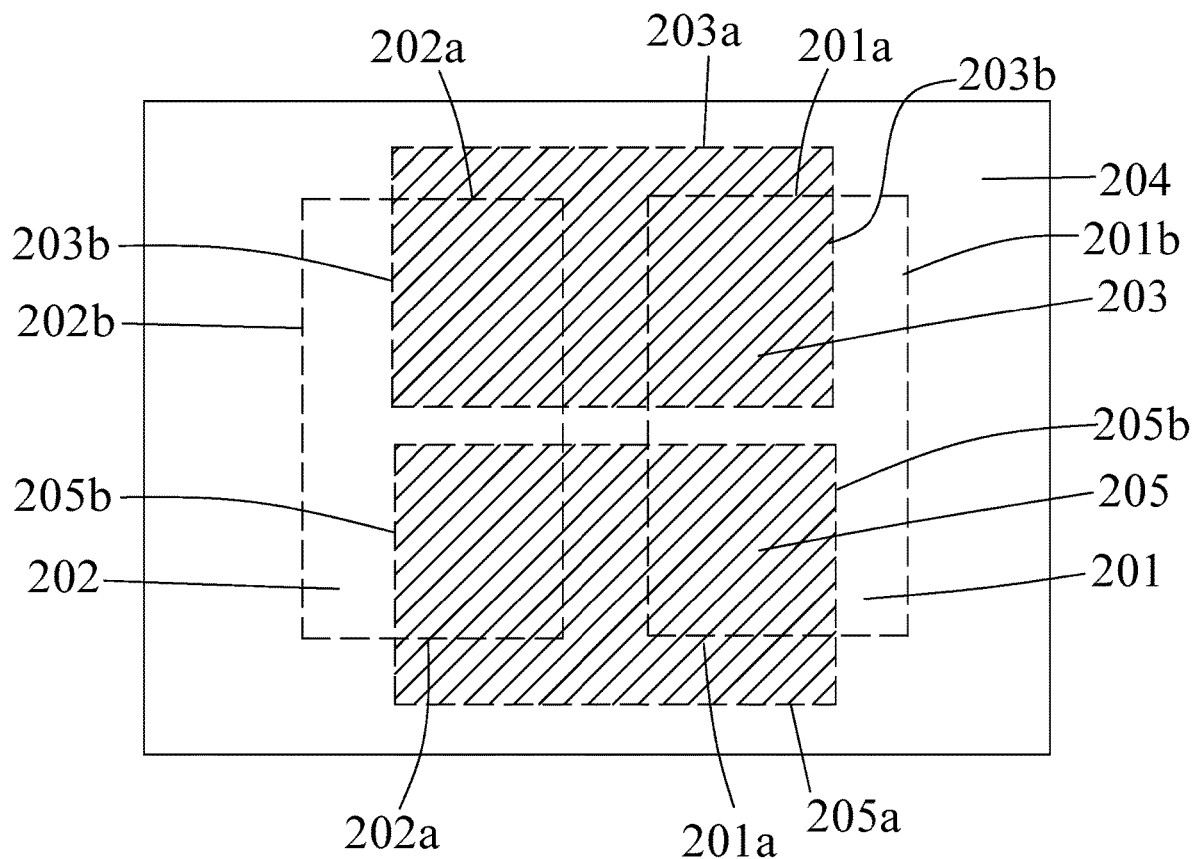
FIG. 28 is a schematic top view of a semiconductor structure in accordance with some embodiments of the present disclosure.
Figure 29:
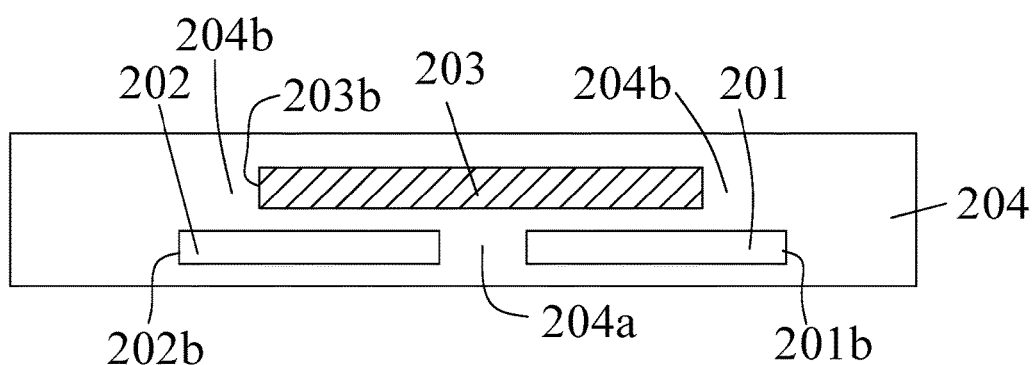
FIG. 29 is a schematic cross sectional view of a semiconductor structure of FIG. 28.

FIGS. 28 and 29 are a semiconductor structure in accordance with various embodiments of the present disclosure. FIG. 28 shows a top view of the semiconductor structure and FIG. 29 shows a cross sectional view of the semiconductor structure of FIG. 28. In some embodiments, the semiconductor structure is a package. In some embodiments, the semiconductor structure includes a first die 201, a second die 202, a third die 203, a fourth die 205 and a dielectric material 204. In some embodiments, the first die 201, the second die 202, the third die 203 and the dielectric material 204 have similar configuration as described above or illustrated in any one of FIGS. 20-27. In some embodiments, the fourth die 205 has similar configuration as the third die 203. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 28-29. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is horizontally disposed adjacent to the second die 202. In some embodiments, the third die 203 is horizontally disposed adjacent to the fourth die 205. In some embodiments, the third die 203 or the fourth die 205 is disposed over the first die 201 or the second die 202. In some embodiments, an orientation of the first die 201 or the second die 202 is orthogonal to an orientation of the third die 203 or the fourth die 205. In some embodiments, the first die 201, the second die 202, the third die 203 and the fourth die 205 have substantially same dimension or shape.

In some embodiments, the first die 201, the second die 202, the third die 203 and the fourth die 205 are surrounded by the dielectric material 204. In some embodiments, an edge of the third die 203 or an edge of the fourth die 205 is disposed away from an edge of the first die 201 or an edge of the second die 202. In some embodiments, all edges of the first die 201, all edges of the second die 202, all edges of the third die 203 and all edges of the fourth die 205 are not aligned with each other. In some embodiments, none of edges of the third die 203 and none of edges of the fourth die 205 is aligned with one of edges of the first die 201 or one of edges of the second die 202.

In some embodiments, at least a portion of a first edge 203a of the third die 203 or at least a portion of a first edge 205a of the fourth die 205 is protruded from a first edge 201a of the first die 201 or a first edge 202a of the second die 202 along a direction parallel to the first die 201 or the second die 202. In some embodiments, the third die 203 or the fourth die 205 is disposed over a first portion 204a of the dielectric material 204. In some embodiments, the first portion 204a is disposed between the first die 201 and the second die 202.

In some embodiments, at least a portion of a second edge 201b of the first die 201 is protruded from a second edge 203b of the third die 203 or a second edge 205b of the fourth die 205 and away from the second die 202. In some embodiments, at least a portion of a second edge 202b of the second die 202 is protruded from the second edge 203b of the third die 203 or the second edge 205b of the fourth die 205 and away from the first die 201. In some embodiments, a second portion 204b of the dielectric material 204 is disposed over the edge of the first die 201 or the edge of the second die 202. In some embodiments, the second portion 204b at least partially surrounds the third die 203 or the fourth die 205.

Figure 30:
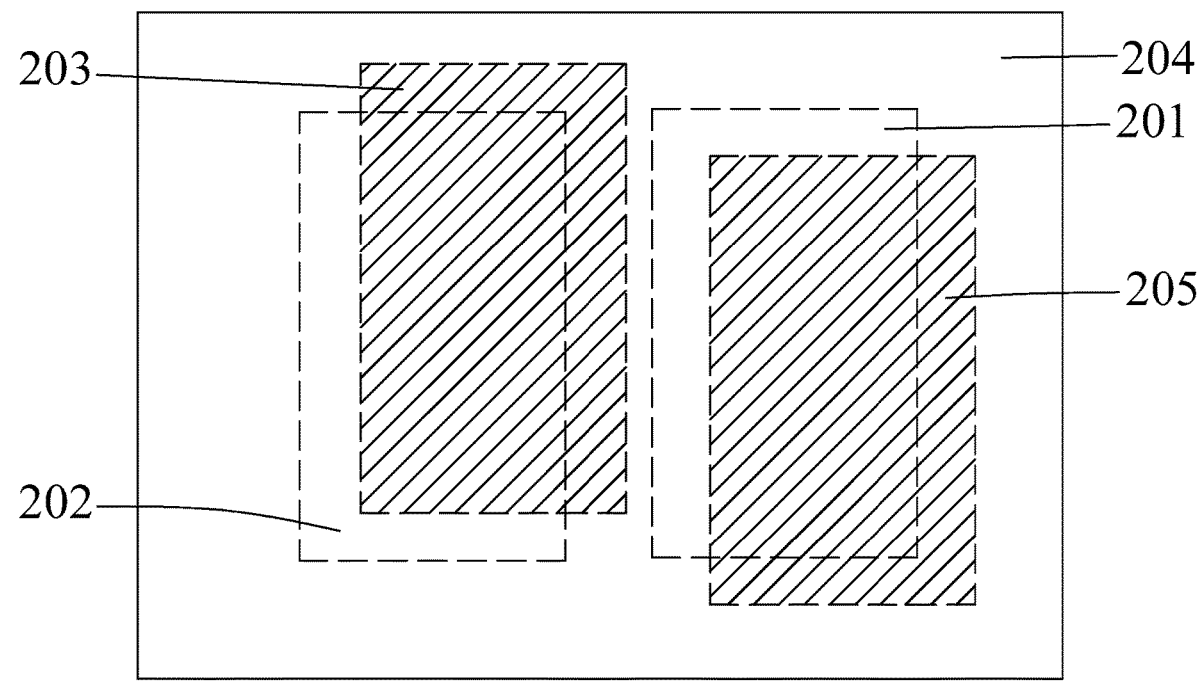
FIG. 30 is a schematic top view of a semiconductor structure in accordance with some embodiments of the present disclosure.
Figure 31:
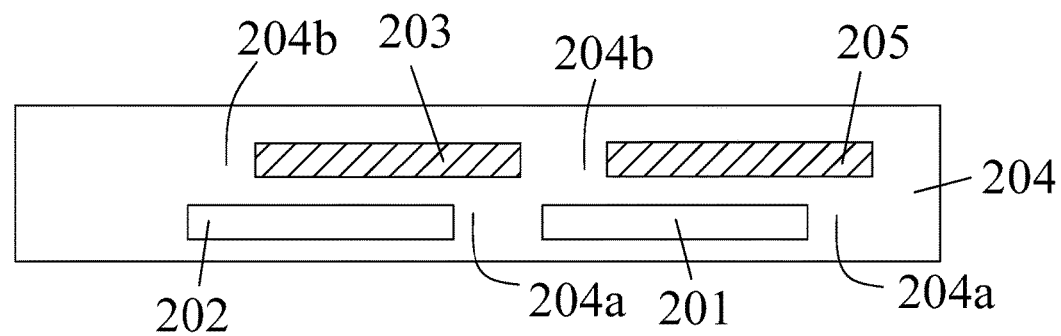
FIG. 31 is a schematic cross sectional view of a semiconductor structure of FIG. 30.

FIGS. 30 and 31 are a semiconductor structure in accordance with various embodiments of the present disclosure. FIG. 30 shows a top view of the semiconductor structure and FIG. 31 shows a cross sectional view of the semiconductor structure of FIG. 30. In some embodiments, the semiconductor structure includes a first die 201, a second die 202, a third die 203, a fourth die 205 and a dielectric material 204, which have similar configuration as described above or illustrated in any one of FIGS. 28-29. In some embodiments, the semiconductor structure also includes interconnect structures such as RDL 301, through via 302, conductive pillar 303, conductive bump 304 and bump pad 305 as described above or illustrated in FIGS. 1-2. For ease of illustration and simplicity, the RDL 301, the through via 302, the conductive pillar 303, the conductive bump 304 and the bump pad 305 have not shown in FIGS. 30-31. It would be understood that the semiconductor structure can include the interconnect structures such as RDL 301, through via 302, conductive pillar 303, conductive bump 304 and bump pad 305, which can be configured in similar manner as described above or shown in FIGS. 1-2.

In some embodiments, the first die 201 is horizontally disposed adjacent to the second die 202. In some embodiments, the third die 203 is horizontally disposed adjacent to the fourth die 205. In some embodiments, the third die 203 or the fourth die 205 is disposed over the first die 201 or the second die 202. In some embodiments, the first die 201, the second die 202, the third die 203 and the fourth die 205 have substantially same dimension or shape.

In some embodiments, the first die 201, the second die 202, the third die 203 and the fourth die 205 are surrounded by the dielectric material 204. In some embodiments, an edge of the third die 203 is disposed away from an edge of the second die 202, and an edge of the fourth die 205 is disposed away from an edge of the first die 201. In some embodiments, all edges of the first die 201, all edges of the second die 202, all edges of the third die 203 and all edges of the fourth die 205 are not aligned with each other. In some embodiments, none of edges of the third die 203 and none of edges of the fourth die 205 is aligned with one of edges of the first die 201 or one of edges of the second die 202.

In some embodiments, a portion the third die 203 is laterally protruded from the second die 202 along a direction parallel to the first die 201 or the second die 202. In some embodiments, a portion of the fourth die 205 is laterally protruded from the first die 201 along a direction parallel to the first die 201 or the second die 202. In some embodiments, the third die 203 is offset from the second die 202, and the fourth die 205 is offset from the first die 201. In some embodiments, edges of the third die 203 are offset from edges of the second die 202, and edges of the fourth die 205 are offset from edges of the first die 201.

In some embodiments, a portion of the third die 203 laterally protruded from the second die 202 or a portion of the fourth die 205 laterally protruded from the first die 201 is disposed over a first portion 204a of the dielectric material 204. In some embodiments, a second portion 204b of the dielectric material 204 is disposed over a portion of the first die 201 or a portion of the second die 202 laterally protruded from the third die 203 or the fourth die 205.

Figure 32:
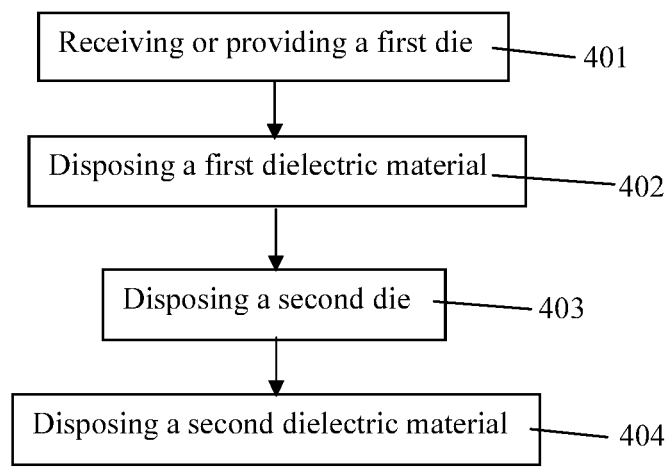
FIG. 32 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 400. The method 400 includes a number of operations and the description and illustration are not deemed as a limitation as the sequence of the operations. FIG. 32 is an embodiment of a method 400 of manufacturing a semiconductor structure. The method 400 includes a number of operations (401, 402, 403 and 404).

Figure 32A:
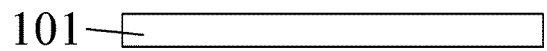
FIGS. 32A-32D are schematic views of manufacturing a semiconductor structure by a method of FIG. 32 in accordance with some embodiments of the present disclosure.

In operation 401, a first die 101 is received or provided as shown in FIG. 32A. In some embodiments, the first die 101 includes a semiconductive substrate fabricated with a predetermined functional circuit over the semiconductive substrate. In some embodiments, the first die 101 includes several conductive lines and several electrical components such as transistor, diode, etc. connected by the conductive lines.

Figure 32B:
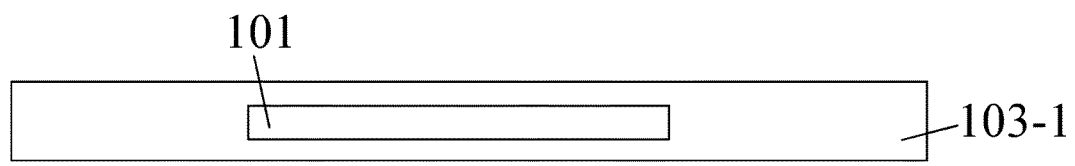

In operation 402, a first dielectric material 103-1 is disposed around the first die 101 as shown in FIG. 32B. In some embodiments, the first die 101 is at least partially surrounded by the first dielectric material 103-1. In some embodiments, the first dielectric material 103-1 covers the first die 101. In some embodiments, the first dielectric material 103-1 includes molding material or molding compound.

Figure 32C:
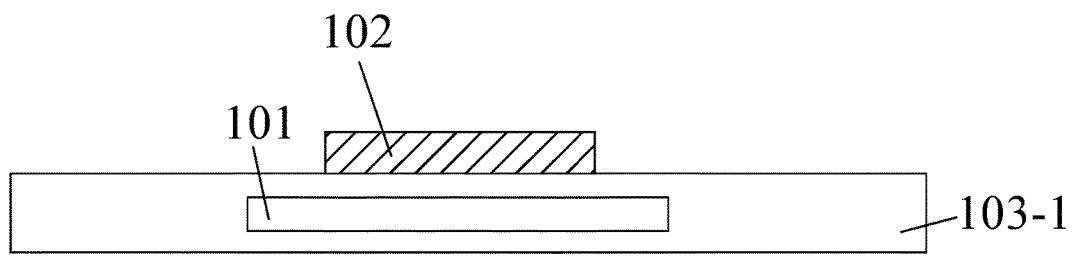

In operation 403, a second die 102 is disposed over the first die 101 as shown in FIG. 32C. In some embodiments, the second die 102 is vertically stacked over the first die 101. In some embodiments, the first die 101 and the second die 102 have substantially same or different dimension or shape. In some embodiments, the second die 102 is disposed in an orientation as illustrated in any one of FIGS. 1-19. In some embodiments, the second die 102 is offset from the first die 101. In some embodiments, the second die 102 is rotated relative to the first die 101. In some embodiments, an edge of the second die 102 aligned with an edge of the first die 101 is absent.

Figure 32D:
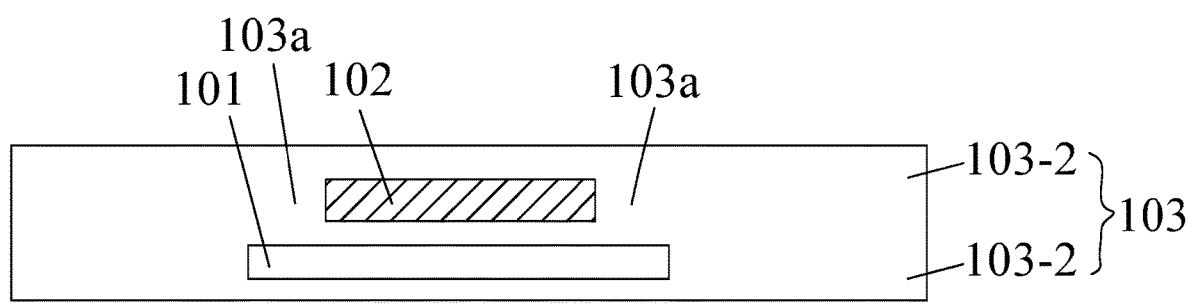

In operation 404, a second dielectric material 103-2 is disposed around the second die 102 as shown in FIG. 32D. In some embodiments, the second die 102 is at least partially surrounded by the second dielectric material 103-2. In some embodiments, the second dielectric material 103-2 covers the second die 102. In some embodiments, the second dielectric material 103-2 includes molding material or molding compound. In some embodiments, the second dielectric material 103-2 includes same or different material from the first dielectric material 103-1. In some embodiments, the first dielectric material 103-1 and the second dielectric material 103-2 become a dielectric material 103. In some embodiments, the dielectric material 103 surrounds or encapsulates the first die 101 and the second die 102.

In some embodiments, interconnect structures such as RDL 301, through via 302, conductive pillar 303, conductive bump 304 and bump pad 305 as described above or illustrated in FIGS. 1-2 are formed in the semiconductor structure. For ease of illustration and simplicity, the RDL 301, the through via 302, the conductive pillar 303, the conductive bump 304 and the bump pad 305 have not shown in FIGS. 32A-32D. It would be understood that the interconnect structures such as RDL 301, through via 302, conductive pillar 303, conductive bump 304 and bump pad 305 can be formed during any one of the operations or between the operations and configured in similar manner as described above or shown in FIGS. 1-2.

Figure 33:
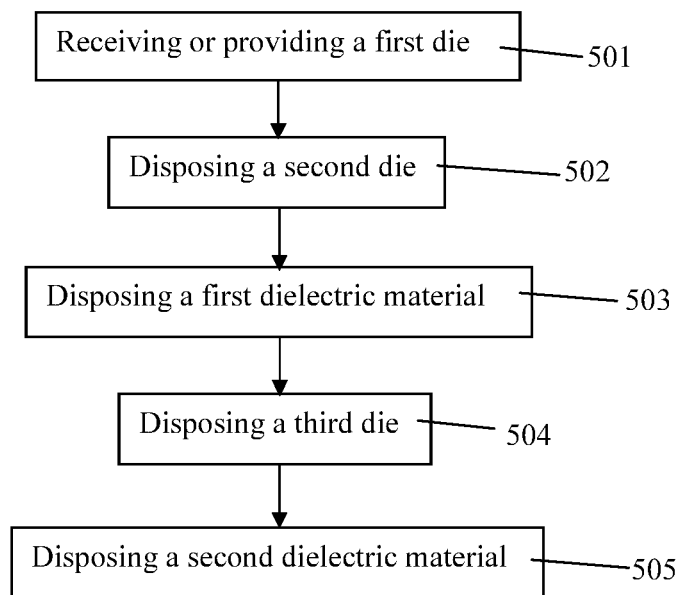
FIG. 33 is a flow diagram of a method of manufacturing a semiconductor structure in accordance with some embodiments of the present disclosure.

In some embodiments, a semiconductor structure is formed by a method 500. The method 500 includes a number of operations and the description and illustration are not deemed as a limitation as the sequence of the operations. FIG. 33 is an embodiment of a method 500 of manufacturing a semiconductor structure. The method 500 includes a number of operations (501, 502, 503, 504 and 505).

Figure 33A:
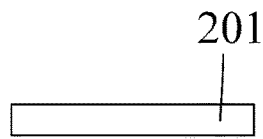
FIGS. 33A-33E are schematic views of manufacturing a semiconductor structure by a method of FIG. 33 in accordance with some embodiments of the present disclosure.
Figure 33B:

In operation 501, a first die 201 is received or provided as shown in FIG. 33A. In some embodiments, the operation 501 is similar to the operation 401. In operation 502, a second die 202 is disposed adjacent to the first die 201 as shown in FIG. 33B. In some embodiments, the second die 202 is horizontally disposed adjacent to the first die 201. In some embodiments, the second die 202 has similar configuration as the first die 201. In some embodiments, the first die 201 and the second die 202 have substantially same or different dimension or shape.

Figure 33C:
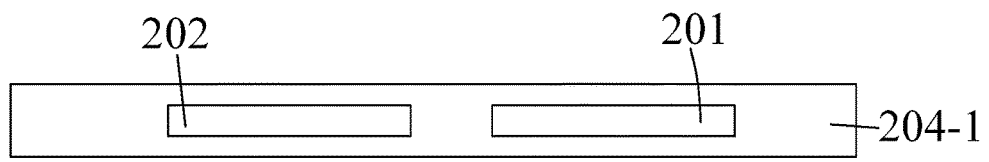

In operation 503, a first dielectric material 204-1 is disposed around the first die 201 and the second die 202 as shown in FIG. 33C. In some embodiments, the first die 201 and the second die 202 are at least partially surrounded by the first dielectric material 204-1. In some embodiments, the first dielectric material 204-1 covers the first die 201 and the second die 202. In some embodiments, the first dielectric material 204-1 includes molding material or molding compound.

Figure 33D:
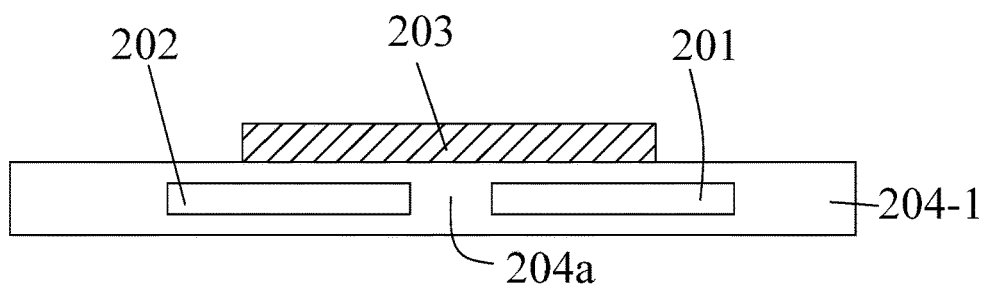

In operation 504, a third die 203 is disposed over the first die 201 or the second die 202 as shown in FIG. 33D. In some embodiments, the third die 203 is vertically stacked over the first die 201 or the second die 202. In some embodiments, the third die 203 has substantially same or different dimension or shape from the first die 201 and the second die 202. In some embodiments, the third die 203 is disposed in an orientation as illustrated in any one of FIGS. 20-27. In some embodiments, the third die 203 is offset from the first die 201 or the second die 202. In some embodiments, the third die 203 is laterally displaced over the first die 201 or the second die 202. In some embodiments, the third die 203 is rotated relative to the first die 201 or the second die 202. In some embodiments, the third die 203 is rotated about a corner of the third die 203 over the first die 201 or the second die 202. In some embodiments, an edge of the third die 203 aligned with an edge of the second die 102 or an edge of the first die 101 is absent. In some embodiments, a first portion 204a of the first dielectric material 204-1 is disposed between the first die 201 and the second die 202. In some embodiments, the third die 203 is disposed over the first portion 204a.

Figure 33E:
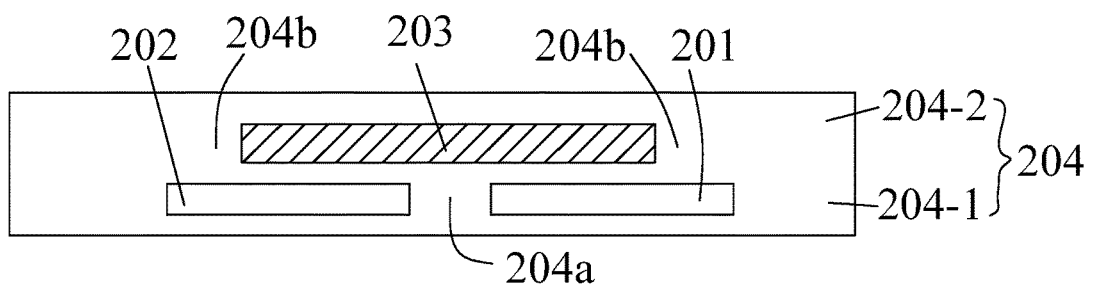

In operation 505, a second dielectric material 204-2 is disposed around the third die 203 as shown in FIG. 33E. In some embodiments, the third die 203 is at least partially surrounded by the second dielectric material 204-2. In some embodiments, the second dielectric material 204-2 covers the third die 203. In some embodiments, the second dielectric material 204-2 includes molding material or molding compound. In some embodiments, the second dielectric material 204-2 includes same or different material from the first dielectric material 204-1. In some embodiments, the first dielectric material 204-1 and the second dielectric material 204-2 become a dielectric material 204. In some embodiments, the dielectric material 103 surrounds or encapsulates the first die 201, the second die 202 and the third die 203.

In some embodiments, interconnect structures such as RDL 301, through via 302, conductive pillar 303, conductive bump 304 and bump pad 305 as described above or illustrated in FIGS. 1-2 are formed in the semiconductor structure. For ease of illustration and simplicity, the RDL 301, the through via 302, the conductive pillar 303, the conductive bump 304 and the bump pad 305 have not shown in FIGS. 33A-33E. It would be understood that the interconnect structures such as RDL 301, through via 302, conductive pillar 303, conductive bump 304 and bump pad 305 can be formed during any one of the operations or between the operations and configured in similar manner as described above or shown in FIGS. 1-2.

In the present disclosure, a semiconductor structure includes at least two dies stacking over each other and a dielectric material encapsulating the dies. The dies are not vertically aligned with each other. An edge of one die aligned with an edge of another die is absent, and therefore internal stress of the semiconductor structure can be reduced and development of crack between the dies and the molding can be minimized or prevented.

In some embodiments, a semiconductor structure is provided. The semiconductor structure includes a plurality of first dies, a second die disposed over each of the first dies, and a dielectric material surrounding the first dies and the second die. The second dies overlaps a portion of each of the first dies.

In some embodiments, each of the first dies includes a first side and a second side perpendicular to the first side from a top view, and the second die includes a third side and a fourth side perpendicular to the third side from the top view. In some embodiments, a length of the first side is greater than a length of the second side, and a length of the third side is less than a length of the fourth side. In some embodiments, the first side of the first die is parallel to the third side of the second die, and the second side of the first die is parallel to the fourth side of the second die. In some embodiments, each of the first dies includes a plurality of first corners, and the second die includes a plurality of second corners. In some embodiments, the first corners are visible form a top view. In some embodiments, the first corners of each first die are overlapped by the second die. In some embodiments, one of the second corners of the second die overlaps one of the first corners of one of the first dies. In some embodiments, a dimension of the second die is different from a dimension of the first dies. In some embodiments, the dielectric material is a molding or includes a molding compound.

In some embodiments, a semiconductor structure is provided. The semiconductor structure includes a plurality of first dies, a plurality of second dies disposed over each of the first dies, and a dielectric material surrounding the first dies or the second dies. In some embodiments, each of the second dies overlaps a portion of each first die.

In some embodiments, each of the first dies includes a first side and a second side perpendicular to the first side from a top view, and the second die includes a third side and a fourth side perpendicular to the third side from the top view. A length of the first side is greater than a length of the second side, and a length of the third side is less than a length of the fourth side. In some embodiments, the first sides of the first dies are parallel to the third sides of the second dies, and the second sides of the first dies are parallel to the fourth sides of the second dies. In some embodiments, the dielectric material is a molding or includes a molding compound.

In some embodiments, a semiconductor structure is provided. The semiconductor structure includes a plurality of first dies, a plurality of second dies disposed over the each of the first dies, and a dielectric material surrounding the first dies and the second dies. In some embodiments, each of the second dies overlaps a portion of one of the first dies.

In some embodiments, each of the first dies includes a plurality of first corners, and each of the second dies overlaps one of the first corners of the one of the first dies. In some embodiments, each of the first dies includes a plurality of first sides, each of the second dies includes a plurality of second sides, and the first sides of the first dies are parallel to the second sides of the second dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of first dies;
a second die disposed over each of the first dies; and
a dielectric material surrounding the plurality of first dies and the second die, wherein the plurality of first dies are in a same level, and the second die overlaps a portion of each of the first dies.

2. The semiconductor structure of claim 1, wherein each of the first dies comprises a first side and a second side perpendicular to the first side from a top view, and the second die comprises a third side and a fourth side perpendicular to the third side from the top view.

3. The semiconductor structure of claim 2, wherein a length of the first side is greater than a length of the second side, and a length of the third side is less than a length of the fourth side.

4. The semiconductor structure of claim 3, wherein the first side of the first die is parallel to the third side of the second die, and the second side of the first die is parallel to the fourth side of the second die.

5. The semiconductor structure of claim 3, wherein the fourth side of the second die and the second side of the first die form an included angle, and the included angle is less than 90°.

6. The semiconductor structure of claim 1, wherein each of the first dies comprises a plurality of first corners, and the second die comprises a plurality of second corners.

7. The semiconductor structure of claim 6, wherein the first corners are visible from a top view.

8. The semiconductor structure of claim 6, wherein the first corners of each first die are overlapped by the second die.

9. The semiconductor structure of claim 6, wherein one of the second corners of the second die overlaps one of the first corners of one of the first dies.

10. The semiconductor structure of claim 1, wherein a dimension of the second die is different from a dimension of the plurality of first dies.

11. The semiconductor structure of claim 1, wherein the dielectric material is a molding or includes a molding compound.

12. A semiconductor structure, comprising:
a plurality of first dies, wherein each of the first dies comprises a first side and a second side perpendicular to the first side from a top view;
a second die disposed over each of the first dies, wherein the second die comprises a third side and a fourth side perpendicular to the third side from the top view; and
a dielectric material surrounding the plurality of first dies and the second die, wherein the plurality of first dies are in a same level, a length of the first side is greater than a length of the second side, a length of the third side is less than a length of the fourth side, the second die overlaps at least a portion of each first die, the first side of the first die is parallel to the third side of the second die, and the second side of the first die is parallel to the fourth side of the second die.

13. The semiconductor structure of claim 12, wherein each of the first dies comprises a plurality of first corners, and the second die comprises a plurality of second corners.

14. The semiconductor structure of claim 13, wherein the first corners are visible from a top view.

15. The semiconductor structure of claim 13, wherein the first corners of each first die are overlapped by the second die.

16. The semiconductor structure of claim 12, wherein a dimension of the second die is different from a dimension of the plurality of first dies.

17. A semiconductor structure, comprising:
a plurality of first dies, wherein each of the first dies comprises a pair of first sides, a pair of second sides perpendicular to the pair of first sides from a top view, and a plurality of first corners formed by the pair of first sides and the pair of second sides;
a second die disposed over each of the first dies, wherein the second die comprises a pair of third side, a pair of fourth side perpendicular to the pair of third side from the top view, and a plurality of second corners formed by the pair of third sides and the pair of fourth sides; and
a dielectric material surrounding the plurality of first dies and the second die, wherein the plurality of first dies are in a same level, the second die overlaps a portion of each first die, the fourth side of the second die and the second side of the first die form an included angle, and the included angle is less than 90°.

18. The semiconductor structure of claim 17, wherein the first corners are visible from a top view.

19. The semiconductor structure of claim 17, wherein one of the second corners of the second die overlaps one of the first corners of one of the first dies.

20. The semiconductor structure of claim 17, wherein a dimension of the second die is different from a dimension of the plurality of first dies.

* * * * *